United States Patent
Kobayashi et al.

[11] Patent Number: 6,162,574
[45] Date of Patent: Dec. 19, 2000

[54] IMAGE RECORDING MATERIAL

[75] Inventors: Fumikazu Kobayashi; Katsuji Kitatani; Yasuhito Oshima, all of Shizuoka-ken, Japan

[73] Assignee: Fuji Photo Film Co., Ltd., Minami-Ashigara, Japan

[21] Appl. No.: 09/140,347

[22] Filed: Aug. 26, 1998

[30] Foreign Application Priority Data

Aug. 29, 1997 [JP] Japan ................... 9-234406
Jan. 20, 1998 [JP] Japan ................... 10-008249

[51] Int. Cl.$^7$ ................... G03F 7/021
[52] U.S. Cl. ........... 430/157; 430/163; 430/176; 430/302; 430/280.1
[58] Field of Search ................... 430/157, 163, 430/171, 175, 302, 280.1

[56] References Cited

U.S. PATENT DOCUMENTS

| | | | |
|---|---|---|---|
| 5,340,699 | 8/1994 | Haley et al. | 430/302 |
| 5,965,319 | 10/1999 | Kobayashi | 430/176 |
| 5,998,082 | 12/1999 | Jimbo et al. | 430/138 |

FOREIGN PATENT DOCUMENTS 0827020  3/1998  European Pat. Off. .

OTHER PUBLICATIONS

Patent Abstracts of Japan, vol. 12, No. 366 (P–765), Sep. 30, 1988 & JP 63 116147 A (Dainippon Ink & Chem. Inc.), May 20, 1988 *abstract*.

*Primary Examiner*—John S. Chu
*Attorney, Agent, or Firm*—Burns, Doane, Swecker & Mathis, LLP

[57] ABSTRACT

An image recording material comprises at least a diazonium salt represented by following general formula (1), an infrared ray absorbing agent, a cross-linking agent which is cross-linked in the presence of an acid, and a binder. The image recording material enables direct planographic printing plate production from digital computer signals by conducting recording by using an infrared laser. Further, the image recording material has excellent storability.

general formula (1)

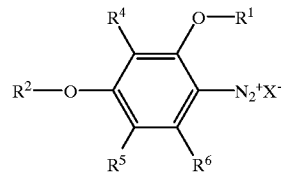

18 Claims, No Drawings

IMAGE RECORDING MATERIAL

BACKGROUND OF THE INVENTION

1. Field of the Invention

The present invention relates to an image recording material which can be used as a planographic printing plate. More particularly, the present invention relates to a negative type image recording material which can be used as a so-called directly producable planographic printing plate on which direct production by using an infrared laser based on digital signals output from a computer or the like is possible.

2. Description of the Related Art

Conventionally, as systems for producing a planographic printing plate directly from digital computer data, there have been proposed (1) a system using an electrophotographic method; (2) a system using a photopolymerizable compound, which is polymerized through exposure by a laser which emits blue or green light; (3) a system using a recording material in which a silver salt is laminated on a photosensitive resin; and (4) a system using a silver salt diffusion transfer method; as well as other methods.

However, the above system (1) using an electrophotographic method has complicated image formation processes such as charging, exposure, developing and the like, and thus, the apparatus for implementing this system becomes complicated and large. In system (2) using a photopolymerizable compound, since a planographic printing plate which is highly sensitive to blue or green light is used, it is difficult to handle in an illuminated room. In methods (3) and (4), since a silver salt is used, there are the disadvantages that processes such as developing and the like become complicated and the waste water naturally contains silver.

In recent years, laser technologies have developed remarkably. In particular, high output and compact solid-state lasers and semiconductor lasers emitting infrared rays of wavelengths of 760 nm to 1,200 nm are readily available. These lasers are very useful as a light source for recording in the direct production of a planographic printing plate from digital data such as digital computer data. However, since most photosensitive recording materials which are useful in practice are sensitive to visible light having wavelengths of 760 nm or less, image recording cannot be carried out with these infrared lasers. Therefore, a material which can be recorded with an infrared laser is desired.

Examples of such image recording materials on which images can be recorded with infrared ray lasers include a recording material comprising an onium salt, a resol resin, a novolak resin, and an infrared ray absorbing agent as disclosed in Japanese Patent Application Laid-Open (JP-A) No. 7-20629. Particularly, an image recording material using a diazonium salt as the onium salt has the merits that sensitivity is excellent in view of management and efficiency, and the material is relatively inexpensive. However, since the diazonium salt is highly reactive, there is the disadvantage that when the diazonium salt is used in an image recording material, the storability is not sufficient.

SUMMARY OF THE INVENTION

Accordingly, an object of the present invention is to provide an image recording material for a planographic printing plate, which enables direct planographic printing plate production based on digital data from a computer or the like by using a solid-state laser or semiconductor laser emitting infrared rays, and which has excellent storability.

This object and other objects can be achieved by the present invention described below. The present invention provides an image recording material comprising at least one diazonium salt representedby the following general formula (1), an infrared ray absorbing agent, a cross-linking agent which is cross-linked in the presence of an acid, and a binder:

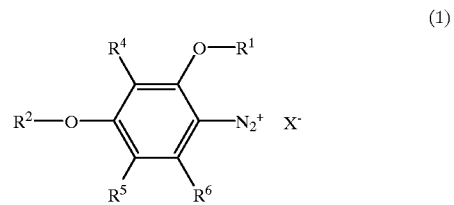

(1)

wherein each of $R_1$ and $R_2$ independently represents a substituted or unsubstituted hydrocarbon group having 20 or fewer carbon atoms, each of $R_4$ and $R_5$ independently represents a hydrogen atom or a substituted or unsubstituted hydrocarbon group having 20 or fewer carbon atoms, $R_6$ represents a hydrogen atom, or a substituted or unsubstituted alkyloxy group, aryloxy group or aralkyloxy group having 20 or fewer carbon atoms, and X represents a counter anion selected from F, Cl, Br, I, $ClO_4$, $BF_4$, $PF_6$, $SbF_6$, $AsF_6$, alkylsulfonate ion or arylsulfonate ion.

In the planographic printing plate using the image recording material of the present invention, light energy of infrared rays emitted by a solid-state laser or semiconductor laser is converted to heat energy by the infrared absorbing agent, and an image is formed by decomposition of the diazonium salt in the presence of the heat energy. Namely, an acid generated by the decomposition of the diazonium salt promotes the cross-linking reaction of the cross-linking agent with the binder, which are cross-linked in the presence of the acid, so as to carry out the image recording process, i.e., to produce a recording material.

The present invention can provide an image recording material particularly excellent in storability by using the diazonium salt represented by formula (1).

DESCRIPTION OF THE PREFERRED EMBODIMENTS

Components according to the present invention will be described in detail below. First, the diazonium salt which is a characteristic component of the present invention will be described.

[Diazonium Salt]

The diazonium salt used in the image recording material of the present invention is represented by general formula (1).

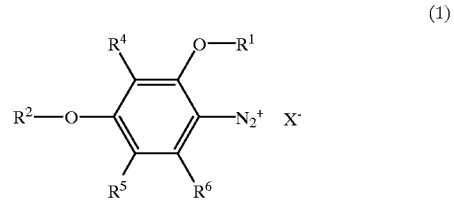

(1)

In the formula, each of $R_1$ and $R_2$ independently represents a substituted or unsubstituted hydrocarbon group having 20 or fewer carbon atoms, each of $R_4$ and $R_5$ independently represents a hydrogen, or a substituted or unsubstituted hydrocarbon group having 20 or fewer carbon atoms, $R_6$ represents a hydrogen, or a substituted or unsubstituted alkyloxy group, aryloxy group or aralkyloxy group having 20 or fewer carbon atoms, and X represents a counter anion selected from F, Cl, Br, I, $ClO_4$, $BF_4$, $PF_6$, $SbF_6$, $AsF_6$, alkylsulfonate ion or arylsulfonate ion.

In formula (1), it is preferable that each of $R_1$ and $R_2$ independently represents a liner, branched or alicyclic alkyl group having 1 to 12 carbon atoms, an aromatic ring having 6 to 10 carbon atoms or an aralkyl group having 7 to 12 carbon atoms, each of $R_4$ and $R_5$ independently represents a hydrogen atom, or a linear, branched or alicyclic alkyl group having 1 to 10 carbon atoms, and R6 represents a hydrogen atom, or a linear, branched or alicyclic alkyloxy group having 1 to 12 carbon atoms, an aryloxy group having 6 to 10 carbon atoms or an aralkyloxy group having 7 to 12 carbon atoms.

Among diazonium salts represented by general formula (1) particularly preferable is a diazonium salt represented by the following general formula (2) which corresponds to general formula (1) wherein $R_6$ represents an alkyloxy group, aryloxy group, aralkyloxy group, or the like, or represents —$OR_3$.

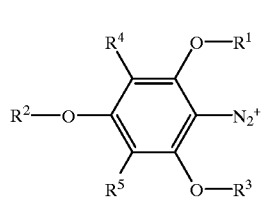

(2)

In general formula (2), each of $R_1$, $R_2$ and $R_3$ independently represents a linear, branched or alicyclic alkyl group having 1 to 12 carbon atoms, an aromatic ring having 6 to 10 carbon atoms or an aralkyl group having 7 to 12 carbon atoms, and each of $R_4$ and $R_5$ independently represents a hydrogen atom, or a linear, branched or alicyclic alkyl group having 1 to 10 carbon atoms. X represents a counter anion selected from F, Cl, Br, I, $ClO_4$, $BF_4$, $PF_6$, $SbF_6$, $AsF_6$, alkylsulfonate ion or arylsulfonate ion.

In general formula (2), specific examples of the hydrocarbon group represented by $R_1$, $R_2$ and $R_3$ include alkyl groups such as a methyl group, ethyl group, n-propyl group, i-propyl group, allyl group, n-butyl group, sec-butyl group, t-butyl group, hexyl group, cyclohexyl group, octyl group, 2-ethylhexyl group, dodecyl group and the like; alkenyl groups such as a vinyl group, 1-methylvinyl group, 2-phenylvinyl group and the like; aralkyl groups such as a benzyl group, phenethyl group and the like; and aryl groups such as a phenyl group, tolyl group, xylyl group, cumenyl group, mesityl group, dodecylphenyl group, phenylphenyl group, naphthyl group, anthracenyl group and the like.

These hydrocarbon groups may have a substituent such as, for example, a halogen atom, hydroxy group, alkoxy group, allyloxy group, nitro group, cyano group, carbonyl group, carboxyl group, alkoxycarbonyl group, anilino group, acetamide group and the like. Specific examples of the hydrocarbon group having a substituent include a trifluoromethyl group, 2-methoxyethyl group, camphan-10-yl group, fluorophenyl group, chlorophenyl group, bromophenyl group, iodophenyl group, methoxyphenyl group, hydroxyphenyl group, phenoxyphenyl group, nitrophenyl group, cyanophenyl group, carboxyphenyl group, anilinophenyl group, anilinocarbonylphenyl group, morpholinophenyl group, phenylazophenyl group, methoxynaphthyl group, hydroxynaphthyl group, nitronaphthyl group, dimethoxyanthracenyl group, diethoxyanthracenyl group, anthraquinonyl group and the like.

When each of $R_4$ and $R_5$ represents a hydrocarbon group, they may be any of the groups listed above as examples of $R_1$, $R_2$ and $R_3$.

Examples of the cation part of the diazonium salt represented by general formula (1) and its preferable embodiment general formula (2) include, but are not limited to, diazonium ions represented by the structures illustrated below. Among the following structures, specific examples of the diazonium salt represented by general formula (2) which is a preferred embodiment are marked with I.

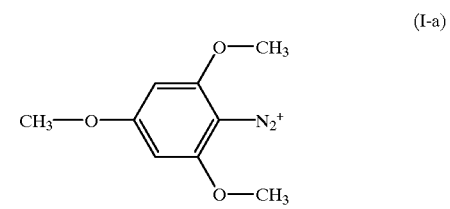
(I-a)

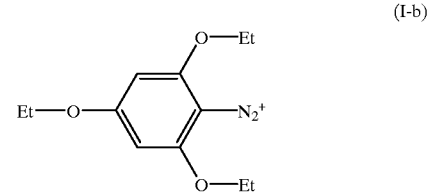
(I-b)

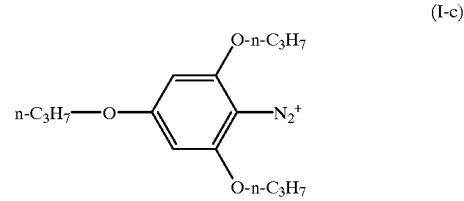
(I-c)

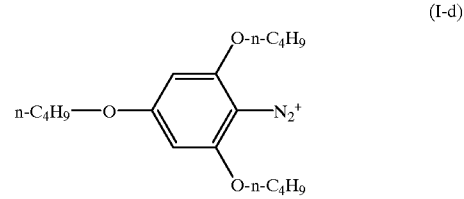
(I-d)

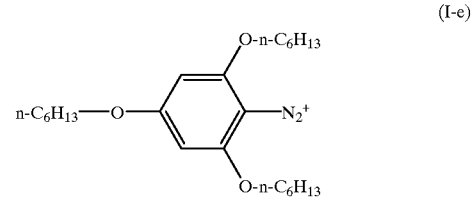
(I-e)

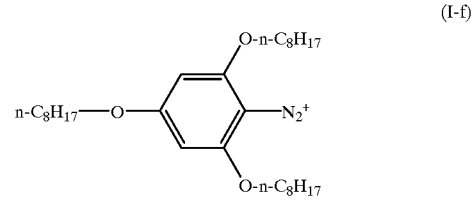
(I-f)

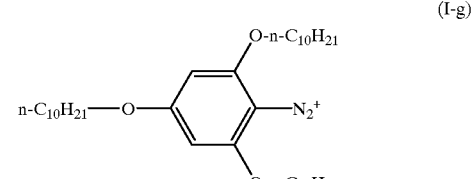
(I-g)

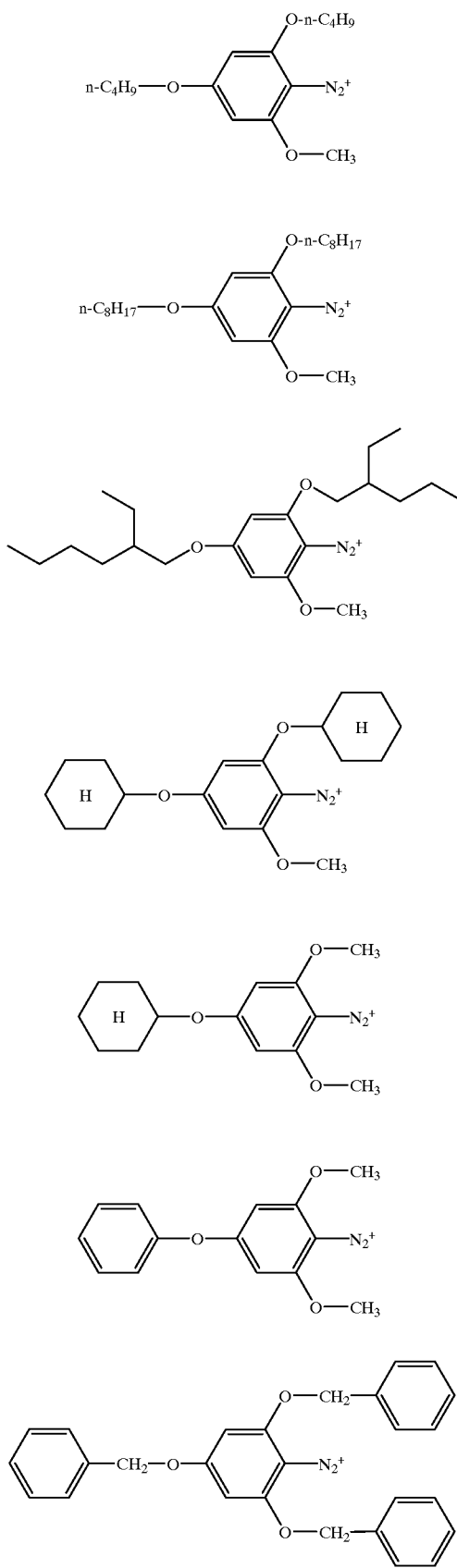
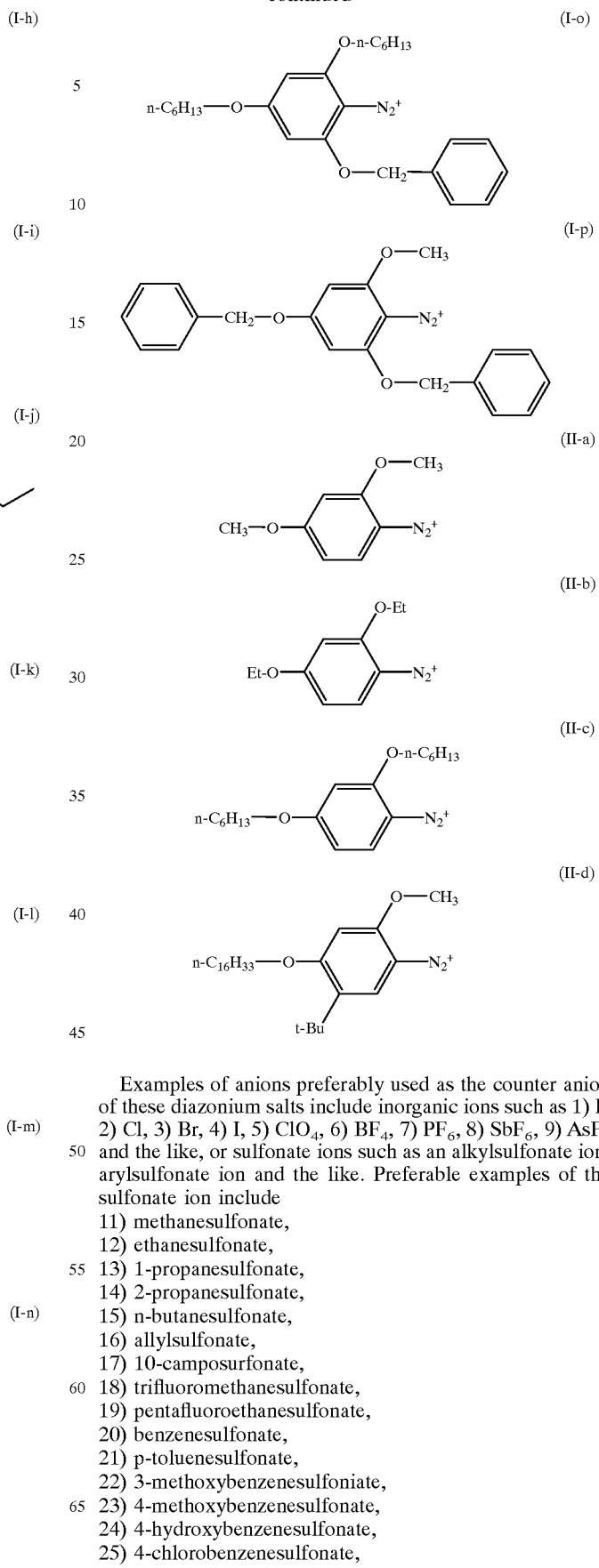

Examples of anions preferably used as the counter anion of these diazonium salts include inorganic ions such as 1) F, 2) Cl, 3) Br, 4) I, 5) ClO$_4$, 6) BF$_4$, 7) PF$_6$, 8) SbF$_6$, 9) AsF$_6$ and the like, or sulfonate ions such as an alkylsulfonate ion, arylsulfonate ion and the like. Preferable examples of the sulfonate ion include 11) methanesulfonate,
12) ethanesulfonate,
13) 1-propanesulfonate,
14) 2-propanesulfonate,
15) n-butanesulfonate,
16) allylsulfonate,
17) 10-camposurfonate,
18) trifluoromethanesulfonate,
19) pentafluoroethanesulfonate,
20) benzenesulfonate,
21) p-toluenesulfonate,
22) 3-methoxybenzenesulfoniate,
23) 4-methoxybenzenesulfonate,
24) 4-hydroxybenzenesulfonate,
25) 4-chlorobenzenesulfonate, 26) 3-nitrobenzenesulfonate,
27) 4-nitrobenzenesulfonate,
28) 4-acetylbenzenesulfonate,
29) pentafluorobenzenesulfonate,
30) 4-dodecylbenzenesulfonate,
31) mesitylenesulfonate,
32) 2,4,6-triisopropylbenzenesulfonate,
33) 2-hydroxy-4-methoxybenzophenone-5-sulfonate,
34) dimethylisophthalate-5-sulfonate,
35) diphenylamine-4-sulfonate,
36) 1-naphthalenesulfonate,
37) 2-naphthalenesulfonate,
38) 2-naphthol-6-sulfonate,
39) 2-naphthol-7-sulfonate,
40) anthraquinone-1-sulfonate,
41) anthraquinone-2-sulfonate,
42) 9,10-dimethoxyanthracene-2-sulfonate,
43) 9,10-diethoxyanthracene-2-sulfonate,
44) quinoline-8-sulfonate,
45) 8-hydroxyquinoline-5-sulfonate,
46) 8-anilino-naphthalene-1-sulfonate,
and the like.

Salts of diazonium salt having 2 equivalent cations with disulfonates may also be used, such as:
51) m-benzene disulfonate,
52) benzaldehyde-2,4-disulfonate,
53) 1,5-naphthalene disulfonate,
54) 2,6-naphthalene disulfonate,
55) 2,7-naphthalene disulfonate,
56) anthraquinone-1,5-disulfonate,
57) anthraquinone-1,8-disulfonate,
58) anthraquinone-2,6-disulfonate,
59) 9,10-dimethoxyanthracene-2,6-disulfonate,
60) 9,10-diethoxyanthracene-2,6-disulfonate,
61) dodecyldiphenyl ether disulfonate,
and the like.

Specific examples of the above-listed diazonium salts used in the present invention will be described below. Regarding the marks listed next to the compounds, the first two marks (the Roman number and the small letter, for example, "I-b") are marks given to the above-listed preferable examples of the cation part of the diazonium salt, and the last mark (the Arabic number, for example, "33") is the number of the counter anion of the above-listed preferable examples of the counter anions.

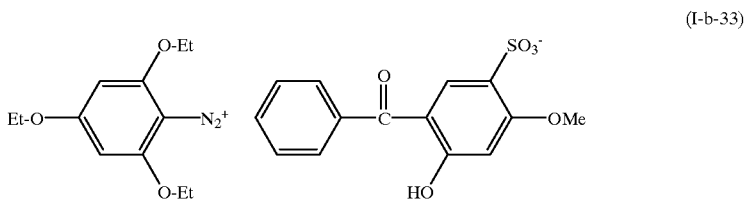

(I-b-33)

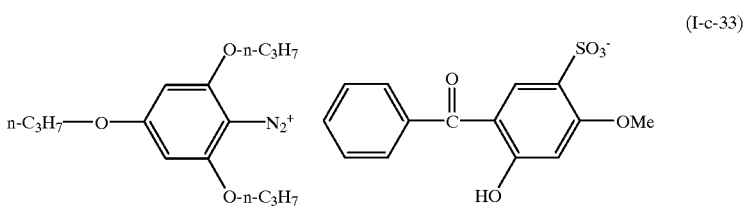

(I-c-33)

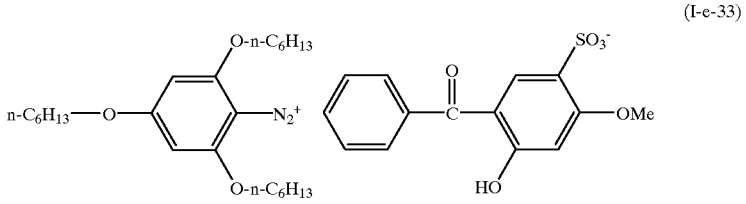

(I-e-33)

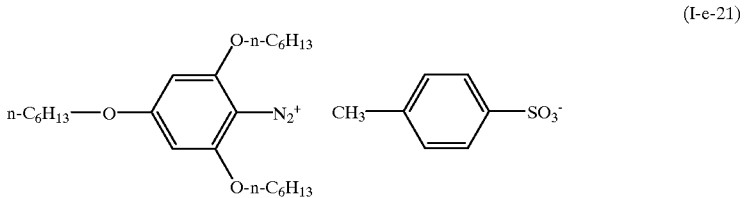

(I-e-21)

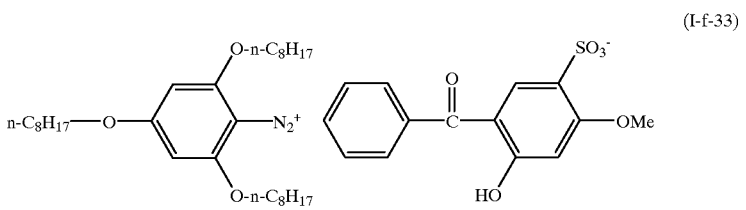

(I-f-33)

-continued (I-e-7)
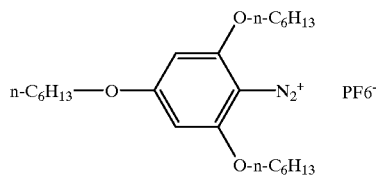

(I-i-33)
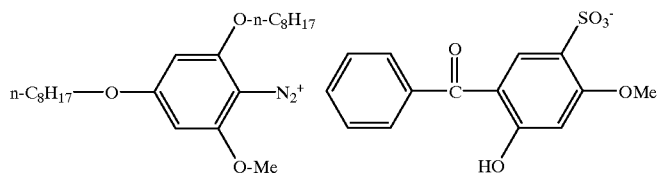

(I-d-33)
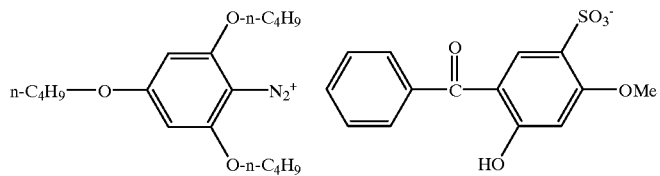

(II-c-33)
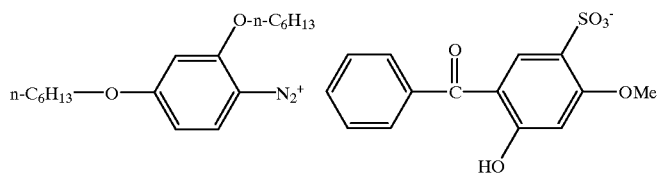

(II-c-21)
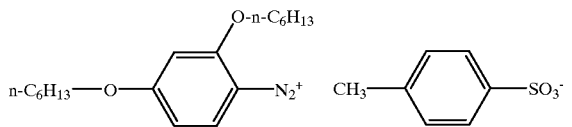

(II-c-7)
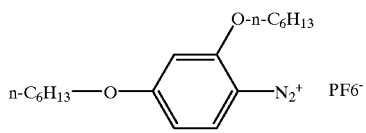

The components of the image recording material of the present invention other than the diazonium salt will be described below.

[Infrared Ray Absorbing Agents]

Infrared ray absorbing agents used in the present invention are dyes or pigments effectively absorbing an infrared ray having a wavelength of 760 nm to 1,200 nm. It is preferable that the dyes or pigments have a maximum absorption between the wavelengths of 760 nm and 1,200 nm.

Known dyes commercially available or those disclosed in literature (such as "Senryo Binran (Dye Handbook)" edited by Yuki Gosei Kagaku Kyokai (Organic Synthetic Chemistry Association), published in 1970) can be used as the dye. Specifically, examples include azo dyes, metal complex salt azo dyes, pyrazolone azo dyes, naphthoquinone dyes, anthraquinone dyes, phthalocyanine dyes, carbonium dyes, quinoneimine dyes, methyne dyes, cyanine dyes, squalilium pigments, pyrylium salts, metal thiolate complexes and the like.

Examples of preferable dyes include cyanine dyes disclosed in JP-A Nos. 58-125246, 59-84356, 59-202829, and 60-78787; methyne dyes disclosed in JP-A Nos. 58-173696, 58-181690, and 58-194595; naphthoquinone dyes disclosed in JP-A Nos. 58-112793, 58-224793, 59-48187, 59-73996, 60-52940, and 60-63744; squalilium dyes disclosed in JP-A No. 58-112792; cyanine dyes disclosed in U.K. Patent No. 434,875; and the like.

Furthermore, near infrared absorption sensitizing agents disclosed in U.S. Pat. No. 5,156,938 can be preferably used. Moreover, substituted aryl benzo(thio)pyrylium salts disclosed in U.S. Pat. No. 3,881,924; trimethynethiapyrylium salts disclosed in JP-A No. 57-142645 (U.S. Pat. No. 4,327,169); pyrylium-containing compounds disclosed in JP-A Nos. 58-181051, 58-220143, 59-41363, 59-84248, 59-84249, 59-146063, and 59-146061; cyanine dyes disclosed in JP-A No. 59-216146; pentamethyne thiopyrylium salts disclosed in U.S. Pat. No. 4,283,475; and pyrylium compounds disclosed in Japanese Patent Application Publication (JP-B) Nos. 5-13514 and 5-19702 can be preferably used as well.

Near infrared absorption dyes represented by formulas (I) and (II) disclosed in U.S. Pat. No. 4,756,993 can be listed as other examples of preferable dyes.

Among these dyes, particularly preferable are cyanine dyes, squalilium dyes, pyrylium salts, and nickel thiolate complexes.

Example of pigments used in the present invention include commercially available pigments and those disclosed in the Color Index (C. I.) Manual; "Saishin Ganryo Binran (Modern Pigment Manual)" edited by Nippon Ganryo Gijutsu Kyokai (Japan Pigment Technology Association), published in 1977; "Saishin Ganryo Oyo Gijutsu (Modern Pigment Application Technology)" by CMC Press, published in 1986; and "Insatsu Ink Gijutsu (Printing Ink Technology)" by CMC Press, published in 1984.

Examples of pigments include black pigments, yellow pigments, orange pigments, brown pigments, red pigments, purple pigments, blue pigments, green pigments, fluorescent pigments, metal powder pigments, and polymer bond pigments. Specifically, insoluble azo pigments, azo lake pigments, condensation azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, carbon black, and the like can be used. Among these examples, carbon black is preferable.

These pigments can be used with or without surface treatment. Examples of surface treatment methods include a method of surface coating with a resin or a wax, a method of adhering a surfactant, and a method of bonding a reactive substance (such as a silane coupling agent, an epoxy compound, polyisocyanate, or the like) with the pigment surface. The above-mentioned surface treatment methods are disclosed in "Kinzokusekken no Seishitsu to Oyo (Natures and Applications of Metal Soaps)" by Sachi Press; "Insatsu Ink Gijutsu (Printing Ink Technology)" by CMC Press, published in 1984; and "Saishin Ganryo Oyo Gijutsu (Modern Pigment Application Technology)" by CMC Press, published in 1986.

A pigment particle diameter of 0.01 $\mu$m to 10 $\mu$m is preferable, 0.05 $\mu$m to 1 $\mu$m is more preferable, and 0.1 $\mu$m to 1 $\mu$m is the most preferable. A pigment particle diameter smaller than 0.01 $\mu$m is not preferable in terms of the stability of the pigment dispersion in a photosensitive layer coating solution. On the other hand, a pigment particle diameter larger than 10 $\mu$m is not preferable in terms of the uniformity of the image recording layer.

Known dispersing methods employed in ink production or toner production can be used as methods of dispersing the pigment. Examples of dispersing machine which may be used include ultrasonic dispersing machines, sand mills, attritors, pearl mills, super mills, ball mills, impellers, dispersers, KD mills, colloid mills, dynatrons, triple roll mills, and pressure kneaders. Details thereof are described in "Saishin Ganryo Oyo Gijutsu (Modern Pigment Application Technology)" by CMC Press, published in 1986.

These dyes or pigments can be added in an image recording material in an amount of 0.01 to 50% by weight based on the total weight of the solid components in the image recording material, preferably in an amount of 0.1 to 10% by weight, more preferably in an amount of 0.5 to 10% by weight in the case of a dye, and more preferably in an amount of 1.0 to 10% by weight in the case of a pigment. An added amount of a pigment or dye less than 0.01% by weight causes low sensitivity. On the other hand, an amount of more than 50% by weight produces stains in non-image portions at the time of printing.

These dyes or pigments may be added to the same layer as other components, or another layer may be provided and the dyes or pigments added to this other layer.

[Cross-linking Agent which is Cross-Linked in the Presence of an Acid]

The cross-linking agent which is cross-linked in the presence of an acid and which can be used in the present invention (hereinafter referred to as "acid cross-linking agent" or simply "cross-linking agent") will now be described.

Examples of the cross-linking agent preferably used in the present invention include the following compounds.

i) Aromatic compounds substituted by an alkoxymethyl group or hydroxymethyl group, ii) Compounds having an N-hydroxymethyl group, N-alkoxymethyl group or N-acyloxymethyl group, and iii) Epoxy compounds.

These compounds will be described in detail hereinafter.

(i) Examples of the aromatic compounds substituted by an alkoxymethyl group or hydroxymethyl group are aromatic compounds or heterocyclic compounds poly-substituted with a hydroxymethyl group, acetoxymethyl group or alkoxymethyl group. However, resinous compounds called resol resins which are obtained by polycondensation of phenols with aldehydes under a basic condition are excluded. Although resol resins have an excellent cross-linking property, the thermal stability thereof is not sufficient. In particular, when a resol resin is contained in a photosensitive material and stored at a high temperature for a long period of time, uniform development is difficult.

Among the aromatic compounds and heterocyclic compounds poly-substituted with a hydroxymethyl group or alkoxymethyl group, compounds having a hydroxymethyl group or alkoxymethyl group at aposition adjacent to a hydroxyl group are preferable. In the case of the alkoxymethyl group, it is preferable that the alkoxymethyl group is a compound having 18 or fewer carbon atoms. Preferable examples of the aromatic compounds and heterocyclic compounds are compounds represented by general formulae (3) to (6) described below.

general formula (3)

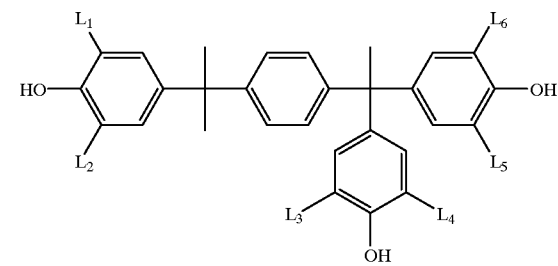

general formula (4)

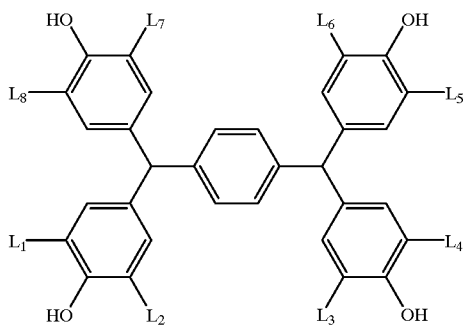

general formula (5)

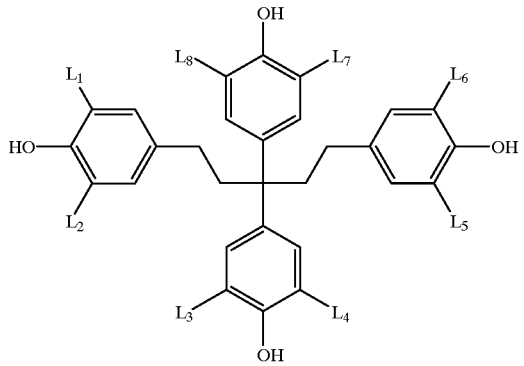

general formula (6)

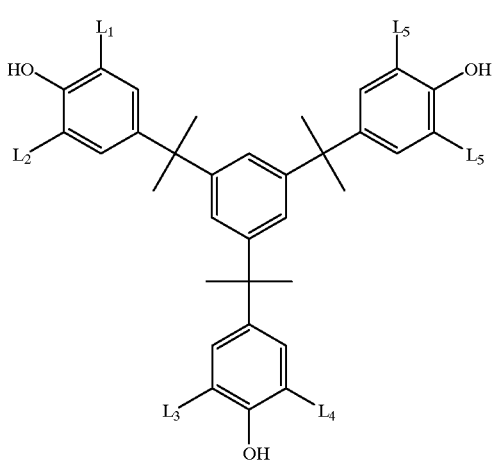

In each formula, each of $L_1$ to $L_8$ independently represents a hydroxymethyl group or alkoxymethyl group substituted with an alkoxy group having 18 or fewer carbon atoms such as methoxymethyl, ethoxymethyl and the like.

These compounds are preferable due to their high cross-linking efficiency and improved printing resistance. The cross-linking compoundslisted as examples above may be used alone or in combination of two or more.

(ii) The compounds having a N-hydroxymethyl group, N-alkoxymethyl group or N-acyloxymethyl group may be the monomers and oligomer-melamine-formaldehyde condensates and urea-formaldehyde condensates disclosed in European Patent Application Laid-Open (EP-A) No. 0,133,216, West German Patent Nos. 3,634,671, 3,711,264, and the alkoxy-substituted compounds disclosed in EP-A No. 0,212,482, and the like.

More preferable examples thereof are, for example, melamine-formaldehyde derivatives having at least two free N-hydroxymethyl groups, N-alkoxymethyl groups or N-acyloxymethyl groups. An N-alkoxymethyl derivative is particularly preferable.

(iii) The epoxy compound may be an epoxy compound in the form of a monomer, dimer, oligomer or polymer, containing one or more epoxy groups. For example, a reaction product of bisphenol A with epichlorohydrin, a reaction product of a low molecular weight phenol-formaldehyde resin with epichlorohydrin, and the like may be listed as examples of the epoxy compound. In addition, the epoxy resins used and described in U.S. Pat. No. 4,026,705 and U.K. Patent No. 1,539,192 may also be listed as examples.

The cross-linking agent described in (i) to (iii) according to the present invention may be used in an amount from 5 to 80% by weight, preferably from 10 to 75% by weight, and particularly preferably from 20 to 70% by weight, based on the total weight of solid components in the image recording material. If the added amount of the cross-linking agent is less than 5% by weight, the durability of the photosensitive layer of the resultant image recording material is poor. Use of an amount of the cross-linking agent of more than 80% by weight is not preferable from the standpoint of stability during storage.

Preferably, (iv) phenol derivatives represented by the following general formula (7) are used as the cross-linking agent.

general formula (7)

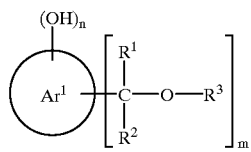

In general formula (7), $Ar^1$ represents an aromatic hydrocarbon ring which may have asubstituent. Preferably, the aromatic hydrocarbon ring is a benzene ring, naphthalene ring or anthracene ring because of the availability of the raw materials. Examples of preferable substituents include a halogen atom, hydrocarbon group having 12 or fewer carbon atoms, alkoxy group having 12 or fewer carbon atoms, alkylthio group having 12 or fewer carbon atoms, cyano group, nitro group, trifluoromethyl group, and the like. More preferably, $Ar^1$ may be a benzene ring or a naphthalene ring having no substituent, a halogen atom, a hydrocarbon group having 6 or fewer carbon atoms, an alkoxy group having 6 or fewer carbon atoms, an alkylthio group having 6 or fewer carbon atoms, or a benzene ring or a naphthalene ring substituted with a nitro group, because of high sensitivity.

$R^1$ and $R_2$, which may be the same or different, represent a hydrogen atom or a hydrocarbon group having 12 or fewer carbon atoms. $R^1$ and $R^2$ particularly preferably represent a hydrogen atom or methyl group because of easy synthesis. $R^3$ represents a hydrogen atom or a hydrocarbon group having 12 or fewer carbon atoms. $R^3$ particularly preferably represents a hydrocarbon group having 7 or fewer carbon atoms such as, for example, a methyl group, ethyl group, propyl group, cyclohexyl group, benzyl group and the like, because of high sensitivity. m is an integer from 2 to 4. n is an integer from 1 to 3.

Specific examples of the phenol derivative represented by general formula (7), which are suitably used in the present invention, include, but are not limited to, the following compounds (cross-linking agents [KZ-1] to [KZ-8]).

[KZ-1]
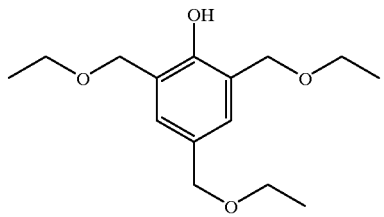

[KZ-2]
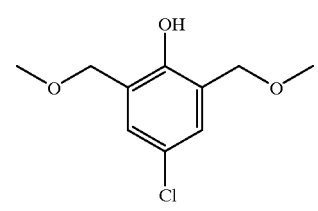

[KZ-3]
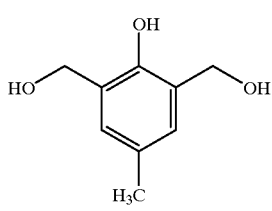

[KZ-4]
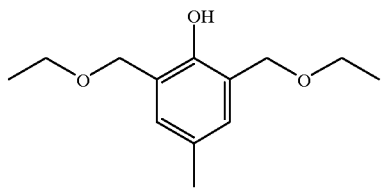

[KZ-5]
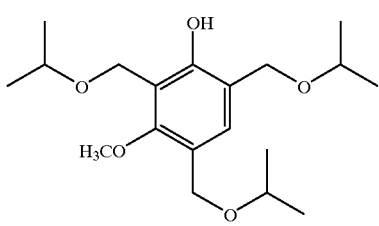

[KZ-6]
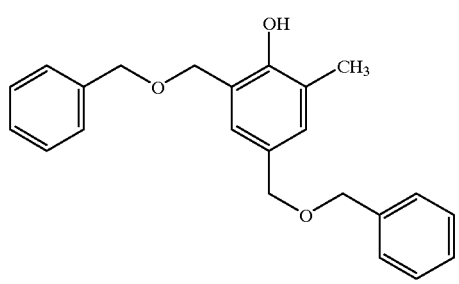

[KZ-7]
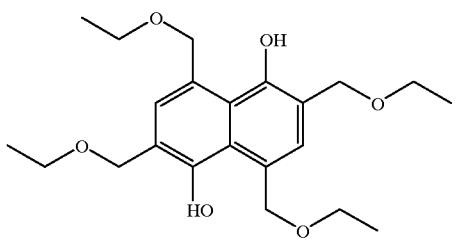

[KZ-8]
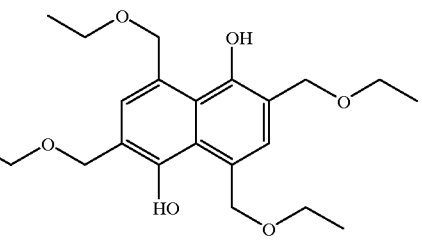

These phenol derivatives can be synthesized by a conventionally known method. For example, [KZ-1] can be synthesized through the process shown in the following reaction formula [1] by reacting phenol, formaldehyde, and a secondary amine such as dimethyl amine, morpholine or the like to obtain a tri(dialkylaminomethyl)phenol, followed by reacting the resulting phenol with acetic anhydride, and further with ethanol in the presence of a weak alkali such as potassium carbonate or the like.

Reaction formula [1]

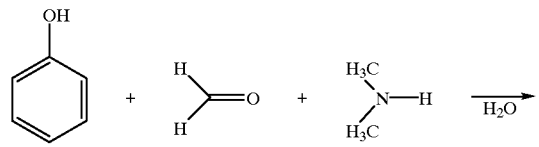

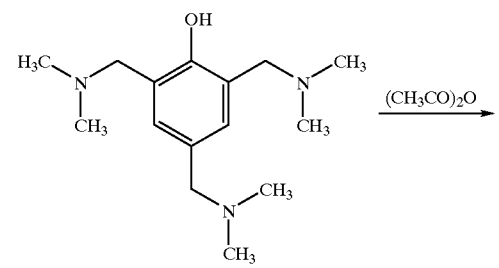

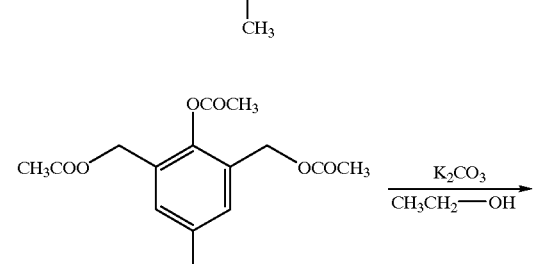

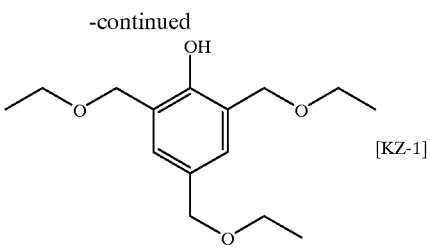
[KZ-1]

Alternatively, the phenol derivative can be synthesized by another method. For example, [KZ-1] can be synthesized through the process shown in the following reaction formula [21] by reacting phenol with formaldehyde or p-formaldehyde in the presence of an alkali such as KOH or the like to obtain 2,4,6-trihydroxymethylphenol, and subsequently reacting the resulting phenol with ethanol in the presence of an acid such as sulfuric acid or the like.

Reaction formula [2]

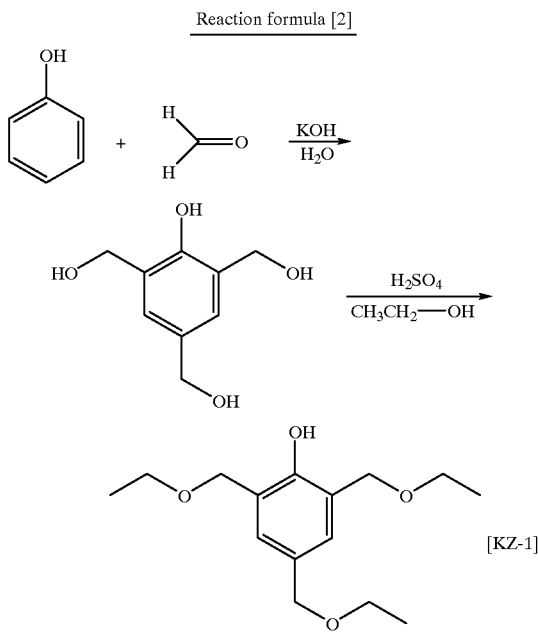
[KZ-1]

These phenol derivatives may be used alone or in combination. When these phenol derivatives are synthesized, the phenol derivatives sometimes may be condensed to each other to produce impurities such as a dimer, trimer and the like as by-products. However, the derivatives may be used with these impurities. In this case, the content of the impurities is preferably 30% or less, and more preferably 20% or less.

In the present invention, the phenol derivative may be used in an amount of from 5 to 70% by weight, preferably from 10 to 50% by weight based on the total weight of solid components in the image recording material. If the amount of the phenol derivative added as a cross-linking agent is less than 5% by weight, the film strength of the image portions when image recording is conducted deteriorates. If the added amount of the phenol derivative is over 70% by weight, stability during storage is poor.

[Binder]

The binder used in the present invention may be a novolak resin, a polymer having a hydroxyaryl group as a side chain, or the like.

The novolak resin is a resin obtained by condensation reaction of phenols with aldehydes in the presence of an acid.

The preferable novolak resin may be a novolak resin obtained from phenol and formaldehyde, a novolak resin obtained from m-cresol and formaldehyde; a novolak resin obtained from p-cresol and formaldehyde, a novolak resin obtained from o-cresol and formaldehyde, a novolak resin obtained from octylphenol and formaldehyde, a novolak resin obtained from m-/p- mixed cresol and formaldehyde, a novolak resin obtained from a mixture of phenol/cresol (any of m-, p-, o- or m-/p-, m-/o-, o-/p-) and formaldehyde, and the like.

The novolak resin preferably has a weight average molecular weight of 800 to 200,000 and a number average molecular weight of 400 to 60,000.

A polymer having a hydroxyaryl group as a side chain may also be used as the binder in the present invention.

In the polymer, the hydroxyaryl group means an aryl group having one or more —OH groups. The aryl group may be, for example, a phenyl group, naphthyl group, anthracenyl group, phenanthrenyl group or the like. From the viewpoints of easy availability and physical properties, a phenyl group or naphthyl group is preferable. Therefore, the hydroxyaryl group may be a hydroxyphenyl group, dihydroxyphenyl group, trihydroxyphenyl group, tetrahydroxyphenyl group, hydroxynaphthyl group, dihydroxynaphthyl group or the like. The hydroxyaryl group may further have a substituent such as a halogen atom, a hydrocarbon group having 20 or fewer carbon atoms, an alkoxy group having 20 or fewer carbon atoms, an aryloxy group having 20 or fewer carbon atoms or the like. The hydroxyaryl group may be bonded to a backbone of the polymer as a pendant group or bonded to the backbone through a connecting group.

The polymer having a hydroxyaryl group as a side chain suitably used in the present invention may be a polymer containing any one of the units represented by the following general formulae (IX) to (XII).

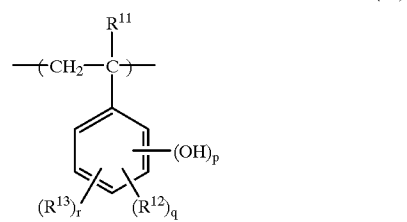
(IX)

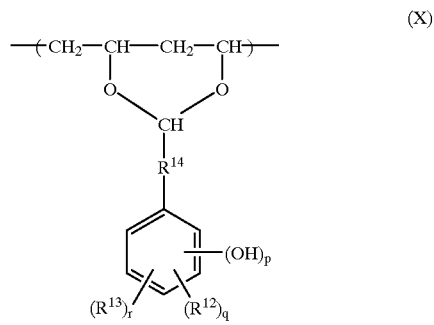
(X)

(XI)

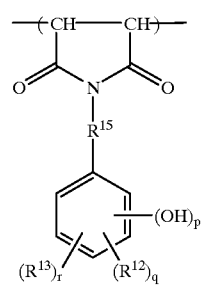

(XII)

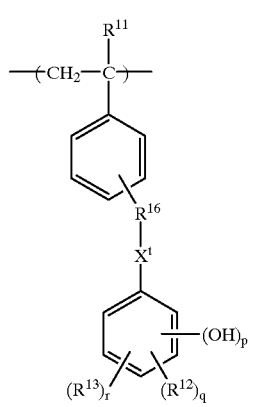

In these formulae, $R^{11}$ represents a hydrogen atom or a methyl group. $R^{12}$ and $R^{13}$ whichmaybe the sameordifferent, represent a hydrogen atom, a halogen atom, a hydrocarbon group having 10 or fewer carbon atoms, an alkoxy group having 10 or fewer carbon atoms, or an aryloxy group having 10 or fewer carbon atoms. Alternatively, $R^{12}$ and $R^{13}$ may be linked to each other to form a ring-condensed benzene ring or cyclohexane ring. $R^{14}$ represents a single bond or a divalent hydrocarbon group having 20 or fewer carbon atoms. $R^{15}$ represents a single bond or a divalent hydrocarbon group having 20 or fewer carbon atoms. R16 represents a single bond or a divalent hydrocarbon group having 10 or fewer carbon atoms. X1 represents a single bond, ether bond, thioether bond, ester bond or amide bond. p is an integer from 1 to 4. Each of q and r is an integer from 0 to 3.

Among the units represented by general formulae (IX) to (XII), specific units suitably used in the present invention tare listed below.

(IX-1)

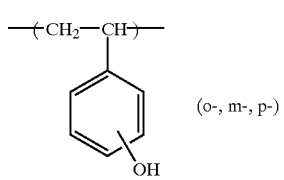

(IX-2)

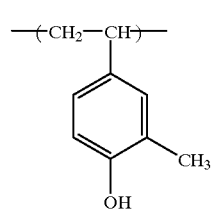

(IX-3)

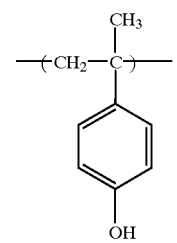

(IX-4)

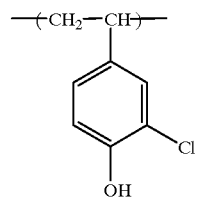

(X-1)

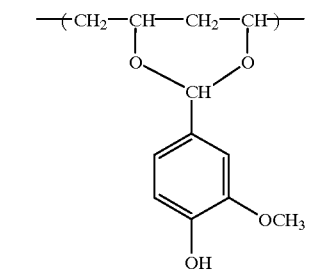

(X-2)

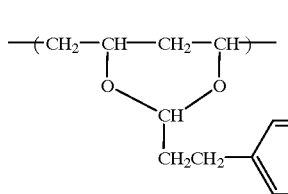

(X-3)

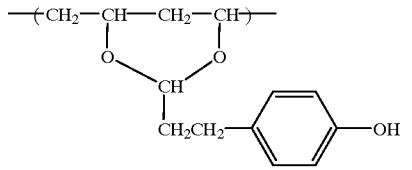

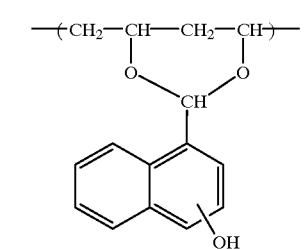 (X-5)
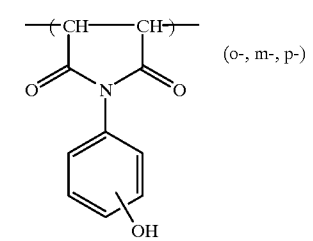 (XI-1) (o-, m-, p-)
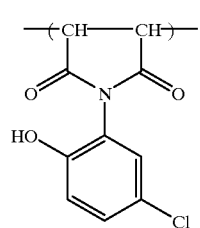 (XI-2)
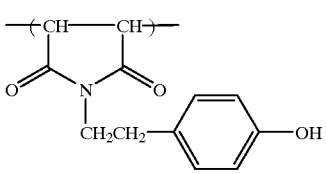 (XI-3)
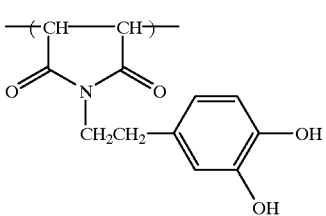 (XI-4)
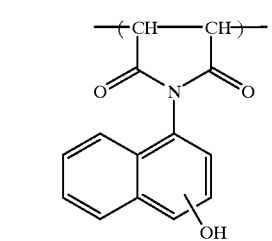 (XI-5)
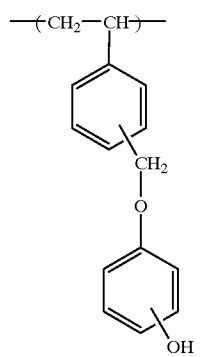 (XII-1)
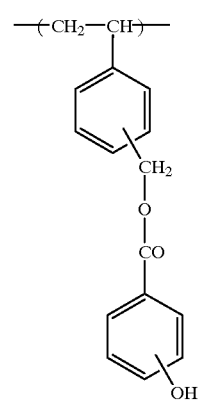 (XII-2)
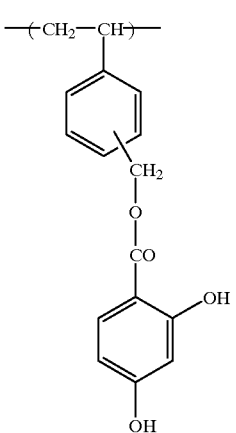 (XII-3)
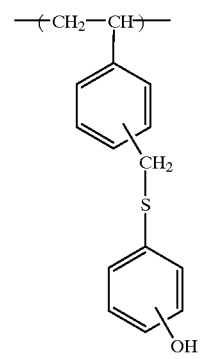 (XII-4)

-continued

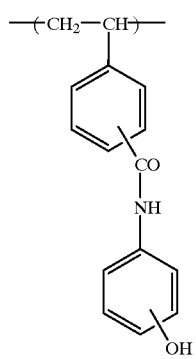
(XII-5)

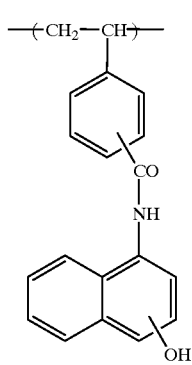
(XII-6)

These polymers can be synthesized by a conventionally known method.

For example, the polymer having an unit represented by general formula (IX) is obtained by conducting radical polymerization or anionic polymerization of a corresponding styrene derivative in which a hydroxyl group is protected as an acetate or t-butyl ether to form a polymer, and thereafter conducting de-protection.

The polymer having an unit represented by general formula (X) can be synthesized by methods described in JP-A Nos. 64-32256 and 64-35436.

Further, the polymer having an unit represented by general formula (XI) is obtained by reacting an amine compound having a hydroxyl group with maleic anhydride to obtain a corresponding monomer, followed by conducting radical polymerization.

Further, the polymer having an unit represented by general formula (XII) is obtained by preparing a monomer corresponding to general formula (XII) by using, as a raw material, styrenes having a functional group such as chlorostyrene, carboxystyrene or the like, which is useful for synthesis, followed by conducting radical polymerization.

In the present invention, the polymer having a hydroxyaryl group may be a homopolymer composed solely of units represented by general formulae (IX) to (XII), or may be a copolymer containing of two or more units represented thereby.

Examples of the other units suitably used in the present invention include units derived from known monomers such as acrylates, methacrylates, acrylamides, methacrylamides, vinyl esters, styrenes, acrylic acid, methacrylic acid, acrylonitrile, maleic anhydride, maleic imide and the like.

Specific examples of the acrylates which can be used include methyl acrylate, ethyl acrylate, (n- or i-)propyl acrylate, (n-, i-, sec- or t-)butyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, glycidyl acrylate, benzyl acrylate, methoxybenzyl acrylate, chlorobenzyl acrylate, 2-(p-hydroxyphenyl) ethyl acrylate, furfuryl acrylate, tetrahydrofurfuryl acrylate, phenyl acrylate, chlorophenyl acrylate, sulfamoylphenyl acrylate, and the like.

Specific examples of the methacrylates include methyl methacrylate, ethyl methacrylate, (n- or i-)propyl methacrylate, (n-, i-, sec- or t-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, methoxybenzyl methacrylate, chlorobenzyl methacrylate, 2-(p-hydroxyphenyl) ethyl methacrylate, furfuryl methacrylate, tetrahydrofurfuryl methacrylate, phenyl methacrylate, chlorophenyl methacrylate, sulfamoylphenyl methacrylate, and the like.

Specific examples of the acrylamides include acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(p-hydroxyphenyl)acrylamide, N-(sulfamoylphenyl) acrylamide, N-(phenylsulfonyl)acrylamide, N-(tolylsulfonyl)acrylamide, N,N-dimethylacrylamide, N-met.hyl-N-phenylacrylamide, N-hydroxyethyl-N-methylacrylamide and the like.

Specific examples of the methacrylamides include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(p-hydroxyphenyl) methacrylamide, N-(sulfamoylphenyl)methacrylamide, N-(phenylsulfonyl)methacrylamide, N-(tolylsulfonyl) methacrylamide, N,N-dimethylmethacrylamide, N-methyl-N-phenylmethacrylamide, N-hydroxyethyl-N-methylmethacrylamide and the like.

Specific examples of the vinyl esters include vinyl acetate, vinyl butylate, vinyl benzoate and the like.

Specific examples of the styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, carboxystyrene and the like.

Examples which are particularly preferably used among these other monomers include acrylates, methacrylates, acrylamides, methacrylamides, vinyl esters, styrenes, acrylic acid, methacrylic acid and acrylonitrile having 20 or fewer carbon atoms.

The ratio of the units represented by general formulae (IX) to (XII) contained in the copolymer in which they are used is preferably from 5 to 100% by weight, and more preferably from 10 to 100% by weight.

The weight average molecular weight of the polymer used in the present invention is preferably 4,000 or more, more preferably from 10,000 to 300,000, and the number average molecular weight is preferably 1,000 or more, and even more preferably from 2,000 to 250,000. The degree of polydispersion (weight average molecular weight/number average molecular weight) is preferably 1 or more, and is more preferably from 1.1 to 10.

Such a polymer may be any one of a random polymer, block polymer, graft polymer or the like, and preferably is a random polymer.

The binder used in the present invention may be used alone or a combination of two or more binders may be used. The added amount of the binder is from 5 to 95% by weight, preferably from 10 to 95% by weight, more preferably from 20 to 90% by weight based on the total weight of solid components in the image recording material. If the added amount of the binder is less than 5% by weight, the durability of the recording layer is poor. If the added amount is more than 95% by weight, an image is not formed.

[Other Components]

In the present invention, various compounds other than the above-described compounds may be added if necessary.

For example, dyes having high absorption in the visible light region can be used as the coloring agent.

Specifically, examples of such dyes include Oil Yellow #101, Oil Yellow #103, Oil Pink #312, Oil Green BG, Oil Blue BOS, Oil Blue #603, Oil Black BY, Oil Black BS, Oil Black T-505 (all of the abovemanufacturedbyorient Chemical Industry, Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes disclosed in JP-A No. 62-293247.

Preferably, these dyes are added after image formation to facilitate distinction between the image portions and the non-image portions. The amount to be added is 0.01 to 10% by weight based on the total weight of the solid components in the image recording material.

In order to enable stable treatment regardless of fluctuations in the development conditions, nonionic surfactants disclosed in JP-A Nos. 62-251740 and 3-208514 and ampholytic surfactants disclosed in JP-A Nos. 59-121044 and 4-13149 can be added to the image recording material of the present invention.

Specific examples of nonionic surfactants include sorbitan tristearate, sorbitan monopalmitate, sorbitan triolate, monoglyceride stearate, and polyoxyethylene nonylphenyl ether, and the like.

Specific examples of ampholytic surfactants include alkyl di(aminoethyl)glycine, alkyl polyaminoethylglycine hydrochloride, 2-alkyl-N-carboxyethyl-N-hydroxyethyl imidazolinium betaine, and N-tetradecyl-N,N-substituted betaine (for example, Amorgen K manufactured by Dai-Ichi Kogyo Co., Ltd.), and the like. The amount of the above-mentioned nonionic surfactants and ampholytic surfactants is preferably from 0.05 to 15% by weight, and more preferably from 0.1 to 5% by weight in the image recording material.

Inorder toprovide the filmwith flexibilityand the like, if necessary, a plasticizer can be added to the image recording material of the present invention. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid, and the like.

In addition to these examples, epoxy compounds, vinyl ethers, and the like may be added.

The image recording material of the present invention can be produced, in general, by dissolving the above-described components in a solvent and applying the resultant solution to an appropriate supporting substrate. Examples of solvents used herein include, but are not limited to, ethylene dichloride, cyclohexanone, methyl ethyl ketone, methanol, ethanol, propanol, ethylene glycol monomethyl ether, 1-methoxy-2-propanol, 2-methoxy ethyl acetate, 1-methoxy-2-propyl acetate, dimethoxyethane, methyl lactate, ethyl lactate, N,N-dimethyl acetamide, N,N-dimethyl formamide, tetramethyl urea, N-methyl pyrrolidone, dimethyl sulfoxide, sulfolane, γ-butyrolactone, toluene, water, and the like. These solvents maybe used alone, or a combination thereof may be used. The concentration of the above-described components (the total solid component including the additives) is preferably from 1 to 50% by weight in the solution. The amount to be applied (solid component) on the supporting substrate depends on the purpose for which the image forming material is to be used. However, when the image forming material is to be used for a planographic printing plate, in general, an amount which is 0.5 to 5.0 g/m$^2$ after coating anddrying is preferable. As the methodof application, any of various methods can be used, such as bar coater application, rotation application, spray application, curtain application, dip application, air knife application, blade application, roll application, and the like. The smaller the amount applied, the greater the apparent sensitivity, but the worse the coating property of the image recording film.

A surfactant for improving the applicability, such as a fluorine-containing surfactant disclosed in JP-A No.62-170950 can be added to the image recording layer in the present invention. The added amount is preferably from 0.01 to 1% by weight, and more preferably from 0.05 to 0.5% by weight based on the total weight of solid components in the image recording material.

A supporting substrate used in the present invention may be a dimensionally stable plate-shaped substance. Examples thereof include paper, paper laminated with plastic (such as polyethylene, polypropylene, and polystyrene), metal plates (such as aluminum, zinc, and copper), plastic films (such as cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and paper or plastic film on which any of the above-listed metals is laminated or deposited.

A polyester film or an aluminum plate is preferable as the supporting substrate in the present invention. An aluminum plate is particularly preferable since it has good dimensional stability and can be provided at a relatively low cost. Examples of preferable aluminum plates include pure aluminum plates and alloy plates comprising aluminum as the main component and trace qualities of a different element. Furthermore, plastic films on which aluminum is laminated or deposited can also be used. Examples of different elements included in the aluminum alloy include silicon, iron, manganese, copper, magnesium, chromium, zinc, bismuth, nickel, and titanium. The amount of the different element in the alloy is preferably 10% by weight or less. In the present invention, pure aluminum is particularly preferable. However, since production of a completely pure aluminum is difficult in terms of refining technology, an aluminum containing a slight amount of a different element can be used. The composition of an aluminum plate applied to the present invention is not specifically defined, and a known aluminum plate can also be used. The thickness of the aluminum plate used in the present invention is from about 0.1 mm to 0.6 mm, preferably from 0.15 mm to 0.4 mm, and more preferably from 0.2 mm to 0.3 mm.

Prior to roughening the surface of the aluminum plate, a degreasing treatment with, for example, a surfactant, an organic solvent, an aqueous alkaline solution, or the like may be conducted to remove the rolling oil on the surface, if desired.

The surface roughening treatment of the aluminum plate can be carried out by using any of various methods, such as, for example, a mechanically roughening method, an electrochemically roughening method in which the plate surface is dissolved, and a chemically roughening method in which a plate surface is dissolved selectively. The mechanical method may be a known method such as a ball abrasion method, brush abrasion method, blast abrasion method, or buff abrasion method. The electrochemically roughening method may be a method in which an alternating current or direct current is applied to the plate in an electrolytic solution containing hydrochloric acid or nitric acid. Further, a method combining both of the above-mentioned methods as disclosed in JP-A No. 54-63902 can be used.

An aluminum plate which has undergone surface roughening treatment may be subjected to an alkaline etching treatment or a neutralizing treatment if necessary, followed by an anodizing treatment so as to improve the water retention property and the abrasion resistance property of the surface if desired. As the electrolyte used in the anodizing treatment of the aluminum plate, any of various electrolytes which form a porous oxide film can be used. In general, sulfuric acid, phosphoric acid, oxalic acid, chromic acid, or a mixture thereof can be used. The concentration of the electrolyte depends on the type of electrolyte and the like.

The conditions of the anodization cannot be determined as a general rule since they change in many ways depending on the electrolyte solution used. However, in general, it is appropriate that the concentration of the electrolyte solution is from 1 to 80% by weight, the temperature of the electrolyte solution is from 5 to 70° C., the current density is from 5 to 60 $A/dm^2$, the voltage is from 1 to 100 V, and the electrolysis time is from 10 seconds to 5 minutes.

An amount of anodized film less than 1.0 $g/m^2$ results in insufficient run length of the planographic printing plate, and scratches are easily produced in non-image portions of the planographic printing plate. Thus, it is easy for so-called "scratch toning", which occurs due to ink adhering to the scratches during printing, to occur.

After the anodizing treatment, the aluminum surface is subjected to a hydrophilic treatment if necessary. Examples of a hydrophilic treatment used in the present invention include an alkaline metal silicate (such as an aqueous solution of sodium silicate) method as disclosed in U.S. Pat. Nos. 2,714,066, 3,181,461, 3,280,734 and 3,902,734. In this method, the supporting substrate is treated by immersion or electrolysis in an aqueous solution of sodium silicate. Other examples include a method of treating with potassium fluorozirconate disclosed in JP-B No. 36-22063 and a method of treating with polyvinyl phosphonate disclosed in U.S. Pat. Nos. 3,276,868, No. 4,153,461 and 4,689,272.

A primer layer may be optionally formed on the supporting substrate in the image recording material of the present invention.

The component of the primer layer may be any of various organic compounds, and may be selected from carboxy methylcellulose; dextrin; gum arabic; organic phosphonic acids, which may be substituted, such as phosphonic acids having an amino group (for example, 2-amino ethyl phosphonic acid), phenyl phosphonic acid, naphthyl phosphonic acid, alkyl phosphonic acid, glycero phosphonic acid, methylene diphosphonic acid and ethylene diphosphonic acid; organic phosphoric acid, which may be substituted, such as phenyl phosphotic acid, naphthyl phosphoric acid, alkyl phosphoric acid and glycero phosphoric acid; organic phosphinic acids, which may be substituted, such as phenyl phosphinic acid, naphthyl phosphinic acid, alkyl phosphinic acid, and glycero phosphinic acid; amino acids such as glycine and β-alanine; and hydrochlorides of amine having a hydroxy group, such as hydrochloride of triethanol amine. These compounds may be used in a mixture of two or more.

The appropriate coated amount of the organic primer layer is from 2 to 200 $mg/m^2$.

A planographic printing plate using the image recording material of the present invention can be produced as described above. An image is exposed on the planographic printing plate by an infrared ray having a wavelength of 760 nm to 1,200 nm emitted from a solid-state laser or a semiconductor laser. In the present invention, the printing plate can be developed Jimmediately after the laser irradiation, but is preferably treated with heat between the laser irradiation process and the developing process. Preferable temperature and time of a heat treatment are a range of 80° C. to 150° C. and a duration of 10 seconds to 5 minutes, respectively. The laser energy needed for recording by laser irradiation can be reduced by the heat treatment.

After the heat treatment, if necessary, the image recording material of the present invention is developed by an aqueous alkaline solution.

A conventionally known aqueous alkaline solution can be used as a developing solution or a replenishing solution for the image recording material of the present invention. Examples thereof include inorganic alkaline salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide. Furthermore, also used are organic alkaline agents such a monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These alkaline agents can be used alone or in combination of two or more.

Particularly preferable developing solutions among these alkaline agents are an aqueous solution of silicate, such as sodium silicate, potassium silicate, or the like, since the developing property can be adjusted by the ratio and concentration of the silicon dioxide $SiO_2$ to the alkaline metal oxide $M_2O$, which are components of the silicate. For example, alkaline metal silicates disclosed in JP-ANO. 54-62004 and JP-B No. 57-7427 can be used efficiently.

Furthermore, it is known that, in a case in which an automatic developing machine is used for developing, by adding to the developing solution an aqueous solution (replenishing solution) whose alkaline strength is greater than that of the developing solution, a large amount of planographic printing plates can be developed without changing the developing solution in the developing tank for a long period of time. The replenishing method is also preferably applied in the present invention.

Various types of surfactants and organic solvents can be added to the developing solution or the replenishing solution to promote or restrain the developing property, to improve the dispersion of developing scum or the conformity of the printing plate image portion to ink, if necessary. Examples of preferable surfactants include anionic surfactants, cationic surfactants, nonionic surfactants, and ampholytic surfactants.

Furthermore, reducing agents such as a sodium salt or a potassium salt of an inorganic acid such as hydroquinone, resorcin, sulfurous acid, and hydrogen sulfurous acid can be added to the developing solution or the replenishing solution, if necessary. Further, organic carboxylic acid, antifoaming agents, and water softeners can be added to the developing solution or the replenishing solution, if necessary.

Printing plates developed with the above-mentioned developing solutions and replenishing solutions are subjected to an after-treatment with a rinsing solution containing water, a surfactant and the like, and with a desensitizing solution containing gum arabic, a starch derivative and the like. These treatments can be used in any of various combinations as the after-treatment when the image recording material of the present invention is used as a printing plate.

Recently, an automatic developing machine for printing plates has been widely used in plate making and printing industries in order to streamline and standardize the plate making operation. In general, this automatic developing machine comprises a developing means and an after-treatment means. Each means comprises a device for conveying a printing plate, treatment solution tanks, and spraying devices. Developing processing is carried out by spraying treatment solutions, which are pumped up by pumps, from spray nozzles to the printing plate after exposure, while the printing plate is being conveyed horizontally. In addition, a processing method has also become known recently in which, after exposure, a printing plate is immersed in treatment solution tanks filled with treatment solutions while the printing plate is being conveyed through the solutions by guide rollers. In such automatic processing, while processing is being carried out, replenishing solutions can be replenished into the respective treatment solutions in accordance with the processed amount of the printing plate, the work time, or the like.

A so-called disposable treating method can also be applied in which treatment is effected with substantially unused processing solutions.

A planographic printing plate obtained as described above can be used for a printing process, after applying a desensitizing gum if desired. However, in a case in which a planographic printing plate having better run length is desired, a burning treatment is used.

If the planographic printing plate is subjected to a burning treatment, it is preferable to treat the plate with a baking conditioner as disclosed in JP-B Nos. 61-2518 and 55-28062, and JP-A Nos. 62-31859 and 61-159655, prior to burning.

Methods of treating the plate with a baking conditioner include a method of applying the baking conditioner on a planographic printing plate with a sponge or an absorbent cotton infused with the baking conditioner, a method of applying the baking conditioner to a printing plate by immersing the plate in a tray filled with the solution, and a method of applying the baking conditioner to the plate by an automatic coater. By making the applied amount of the solution uniform with a squeegee or a squeegee roller after application, a more preferable result can be obtained.

An appropriate amount of a baking conditioner to be applied is 0.03 to 0.8 $g/m^2$ (dry weight), in general.

The planographic printing plate, to which the baking conditioner has been applied and then dried, is heated at a high temperature with a burning processor (such as a burning processor BP-1300 commercially available from Fuji Photo Film Co., Ltd.), if necessary. The heating temperature and the duration of heating depend on the types of components forming the image. However, a range of 100 to 300° C. and a range of 1 to 20 minutes are preferable.

A planographic printing plate treated with the burning treatment can be subjected to conventional treatments such as a water washing treatment, a gum coating treatment, and the like, if necessary. However, in a case in which a baking conditioner containing a water-soluble polymer compound is used, a desensitizing treatment such as gum coating can be omitted.

A planographic printing plate obtained by such treatment is used in an offset printer for printing large quantities.

EXAMPLES

Hereinafter, the present invention will be illustrated in further detail with reference to examples, but is not limited thereto.

[Synthesis of Diazonium Salt]

Synthesis methods for diazonium salts used in the examples are described below. In these synthesis examples, reagents and solvents were purchased from Tokyo Kasei K. K., Wako Junyaku Kogyo K. K. and Aldrich Corp., and were used without any treatment.

Synthesis Example 1

Synthesis of Compound (I-b-33)

1,3,5-Benzene triol was nitrated by a conventional method to obtain 2-nitrobenzene-1,3,5-triol. The resulting 2-nitrobenzene-1,3,5-triol (12g) was reacted with ethyliodide (33 g) and potassium carbonate (29 g) in N,N-dimethylacetamide (30 ml) at 80° C. for 5 hours. Then, to this was poured in water (300 ml), and the precipitated solid was filtered and washed to obtain 2-nitro-1,3,5-triethoxybenzene (13.4 g).

2-Nitro-1,3,5-triethoxybenzene (12.8 g) in isopropyl alcohol (80 ml) was reacted at 90° C. for 2 hours with an iron powder (28 g) and aqueous ammonium chloride solution (2.85 g/water 8.4 ml). This mixture was extracted with ethyl acetate and the solvent of the extract was distilled off. To the resulting solution was further added conc. hydrochloric acid (6 ml), and the mixture was washed with a small amount of aceton to obtain 2,4,6-triethoxyaniline hydrochloride (4.7 g). 2,4,6-Triethoxyaniline hydrochloride (2.6 g) was dissolved in methanol (50 ml), and the solution was acidified with conc. hydrochloric acid (3.5 ml). Then, aqueous sodium nitrite solution (1.4 g/water 10 ml) was added slowly to this solution while cooling with ice. Two hours later, 2-hydroxy-4-methoxybenzophenone-5-sulfonic acid (6.2 g) was added to the solution. One hour later, this mixture was extracted with methylene chloride, and the extract was washed with water. Then, the solvent of the resulting solution was distilled off to obtain 2,4,6-triethoxybenzenediazonium 2-hydroxy-4-methoxybenzophenone-5-sulfonate (4.5 g) as a pale yellow powder.

Further, according to the same procedure, the following diazonium salts were synthesized. 2,4,6-Tris(n-octyloxy)benzenediazonium 2-hydroxy-4-methoxybenzophenone-5- sulfonate (I-f-33); pale yellow powder; mp: 124° C. (decomposition).

2,4,6-Tris(n-hexyloxy)benzenediazonium 2-hydroxy-4-methoxybenzophenone-5-sulfonate (I-e-33); pale yellow powder; mp: 129° C. (decomposition).

2,4,6-Tris(n-hexyloxy)benzenediazonium p-toluenesulfonate (I-e-21); pale yellow powder.

2,4,6-Tris(n-hexyloxy)benzenediazonium hexafluorophosphate (I-e-7); yellow liquid (solidified in a refrigerator).

2,4,6-Tris(n-propyloxy)benzenediazonium 2-hydroxy-4-methoxybenzophenone-5-sulfonate (I-c-33); pale yellow powder.

2,4,6-Tris(n-butyloxy)benzenediazonium 2-hydroxy-4-methoxybenzophenone-5-sulfonate (I-d-33); pale yellow powder.

2,4,6-Triethoxybenzenediazonium mesitylenesulfonate (I-b-31); pale yellow powder; melting point: 128 to 131° C. (decomposition).

Synthesis Example 2

Synthesis of Compound (I-i-33)

2,4,6-Trihydroxyacetophenone (51 g) was reacted with n-octyl bromide (112 g) and potassium carbonate (81 g) in N,N-dimethylacetamide (200 ml) at 100° C. for 4 hours. Then, this solution was poured into water, and this mixture was extracted with ethyl acetate and washed with water. The resulting solution was concentrated by a rotary evaporator. Then, hexane was added and a precipitated solid was filtered to obtain 4,6-bis(n-octyloxy)-2-hydroxyacetophenone (97 g).

4,6-Bis(n-octyloxy)-2-hydroxyacetophenone (20 g) was reacted with methyl p-toluenesulfonate (20 g) and potassium carbonate (7 g) in N,N-dimethylacetamide (50 ml) at 100° C. for 6 hours to obtain 4,6-bis(n-octyloxy)-2-methoxyacetophenone. Thereafter, this was disslowed in ethanol (90 ml), and then potassium hydroxide (3.3 g), hydroxyamine hydrochloride (3.6 g) and water (20 ml) were added. The mixture was reacted at 80° C. for 5 hours, to obtain 4,6-bis(n-octyloxy)-2-methoxyacetophenoneoxime (16 g).

4,6-Bis(n-octyloxy)-2-methoxyacetophenoneoxime (16 g) was dissolved in formic acid (50 ml) and reacted at 100° C. for 3 hours. Then, this mixture was poured into water, extracted with ethyl acetate and the extract was washed with water. Then, the solvent of the resulting solution was distilled off. 4,6-Bis(n-octyloxy)-2-methoxyacetanilide (8 g) was isolated by silica gel column chromatography.

4,6-Bis(n-octyloxy)-2-methoxyacetanilide (1.9 g) was dissolved in methanol (25 ml). To this was added conc. hydrochloric acid (5 ml), and the solutionwas heated for 1 hour. After the solution was allowed to cool, conc. hydrochloric acid (1 ml) was further added to acidify the solution. Then, aqueous sodium nitrite solution (0.5 g/water 10 ml) was slowly added while cooling with ice. Three hours later, 2-hydroxy-4-methoxybenzophenone-5-sulfonic acid (2.4 g) was added. Further, 1 hour later, water was added, and this mixture was filtered and washed with water to obtain 4,6-bis(n-octyloxy)- 2-methoxybenzenediazonium 2-hydroxy-4-methoxybenzophenone-5-sulfonate (2.9 g) as a pale yellow powder.

Synthesis Example 3

Synthesis of Compound (II-c-33)

The following compounds were synthesized from 2,4-dihydroxyacetophenone in accordance with the same procedure as in synthesis example 2.

2,4-Bis(n-hexyloxy)benzenediazonium 2-hydroxy-4-methoxybenzophenone-5-sulfonate (II-c-33); pale yellow powder.

2,4-Bis(n-hexyloxy)benzenediazonium hexafluorophosphate (II-c-7); pale yellow powder.

2,4-Bis (n-hexyloxy)benzenediazoniump-toluenesulfonate (II-c-21); pale yellow powder.

[Production of Supporting Substrate]

An aluminum plate (material 1050) having a thickness of 0.30 mm was degreased by washing with trichloroethylene. A roughening treatment was carried out on the aluminum plate by graining the surface with a nylon brush and an aqueous suspension of 400 mesh pumice powder, and the plate was then washed with water. The plate was etched by being immersed for 9 seconds in a 25% aqueous solution of sodium hydroxide of 45° C., and was then washed with water. Thereafter, the plate was further immersed in 2% $HNO_3$ for 20 seconds and then washed with water. The etching amount of the grained surface was about 3 g/m². Then, the plate was provided with a direct current anodic oxidization film of 3 g/m² by using 7% $H_2SO_4$ as the electrolyte and a current density of 15 A/dm². The plate was then washed with water and dried. Then, the following primer solution was applied to the aluminum plate, and the plate was dried at 80° C. for 30 seconds. After drying, the coated amount was 10 mg/M². The resultant supporting substrate is referred to as a supporting substrate A.

(Composition of primer solution)

| | |
|---|---|
| β-Alanine | 0.1 g |
| Phenylsulfonic acid | 0.05 g |
| Methanol | 40 g |
| Pure water | 60 g |

Examples 1 to 6

[Production of Planographic Printing Plate]

Solution [A]

| | |
|---|---|
| Compound represented by general formula (1) | 0.15 g |
| Infrared absorbing agent IR-Dye-4 | 0.10 g |
| (having the structural formula shown below, manufactured by Nippon Kanko Shikiso Kenkyusho K. K. ) | |
| Novolak resin obtained from phenol and formaldehyde | 1.5 g |
| (weight-average molecular weight 10000) | |
| Cross-liking agent MM-1 | 0.50 g |
| (having the structural formula shown below) | |
| Fluorine-based surfactant | 0.03 g |
| (MEGAFAC F-177, manufactured by Dainippon Ink & Chemicals. Inc.) | |
| Methyl ethyl ketone | 15 g |
| 1-methoxy-2-propanol | 10 g |
| methyl alcohol | 5 g |

[MM-1]

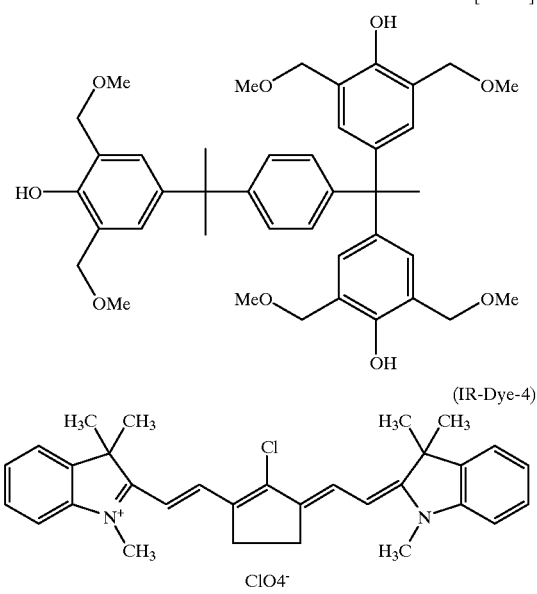

(IR-Dye-4)

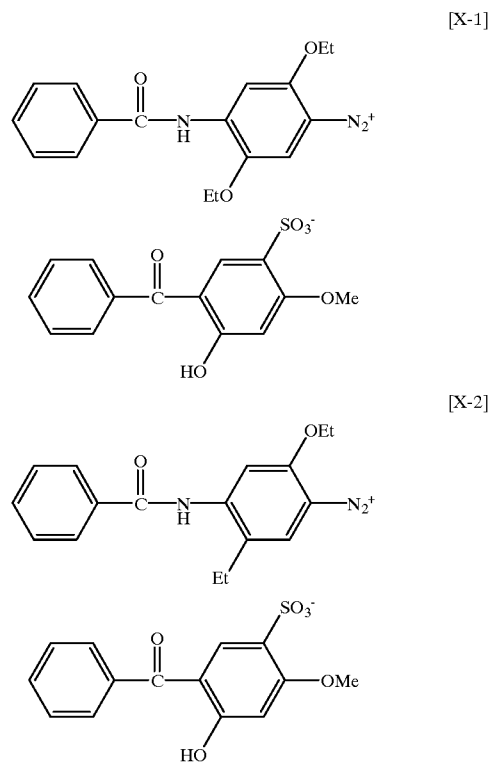

[X-1]

[X-2]

In the solution [A] having the above-described composition, the type of the compound represented by general formula (1) was changed to those listed in Table 1, so as to prepare six types of solutions [A-1] to [A-6]. These solutions were respectively applied on above-described supporting substrates A and dried for 1 minute at 100° C. to obtain negative type planographic printing plates [A-1] to [A-6] The coating weight after drying was 1.3 g/m².

TABLE 1

| Example No. | Planographic Printing Plate | Compound |
|---|---|---|
| Example 1 | A-1 | I-b-33 |
| Example 2 | A-2 | I-c-33 |
| Example 3 | A-3 | I-e-33 |
| Example 4 | A-4 | I-f-33 |
| Example 5 | A-5 | I-i-33 |
| Example 6 | A-6 | I-e-21 |

The resulting negative type planographic printing plates [A-1] to [A-6] were exposed by a semiconductor laser emitting an infrared ray having a wavelength of 830 nm. After exposure, the plates were heated for 1 minute in an oven at 140° C., and then were processed by passing through an automatic developing machine containing a developing solution DP-4 (1:8) and a rinse solution FR-3 (1:7) both manufactured by Fuji Photo Film Co., Ltd. Excellent negative images were obtained on all of the plates.

Further, the negative type planographic printing plates [A-1] to [A-6] were stored for 3 days under high temperature and high humidity conditions of a temperature of 35° C. and a humidity of 75%. Thereafter, the plates were exposed with the semiconductor laser, heated and developed in the same manner as described above. Even after this durability test, excellent negative images were obtained on the respective plates.

Comparative Examples 1 to 2

Negative type planographic printing plates [B-1] and [B-2] were produced in the same manner as in Examples 1 to 6 except that in the solutions [A] used in Examples 1 to 6, diazonium salts (X-1) and (X-2) having the following structures respectively were used instead of the diazonium salt represented by general formula (1).

The resulting negative type planographic printing plates [B-2] and [B-2] were exposed bya semiconductor laser, heated, and developed in the same manner as in Examples 1 to 6 without conducting the above-described durability test. Excellent negative type images were obtained on both plates. However, a negative image could not be formed with either of the Comparative Example [B-1] and [B-2] in a case in which the plates [B-1] and [B-2] were stored for 3 days under high temperature and high humidity conditions of a temperature of 35° C. and a humidity of 75% in the same manner as in Examples 1 to 6, then exposed with the semiconductor laser, heated and developed in the same manner as in Examples 1 to 6.

From the results of Examples 1 to 6 and Comparative Examples 1 and 2, it can be understood that the planographic printing plates using the negative type image recording materials of the present invention have excellent storability under high temperature and high humidity.

Examples 7 to 9

Solution [E]

| | |
|---|---|
| Compound represented by general formula (1) | 0.12 g |
| Infrared absorbing agent IR-Dye-2 | 0.10 g |
| (having the structural formula shown below, manufactured by Nippon Kanko Shikiso Kenkyusho K. K. ) | |
| p-hydroxystyrene polymer | 1.5 g |
| (weight-average molecular weight 8000) | |
| 2,6-bishydroxymethyl-p-cresol | 0.50 g |
| Fluorine-based surfactant | 0.03 g |
| (MEGAFAC F-177, manufactured by Dainippon Ink & Chemicals. Inc.) | |

-continued

| | |
|---|---|
| Methyl ethyl ketone | 15 g |
| 1-methoxy-2-propanol | 10 g |
| methyl alcohol | 5 g |

(IR-Dye-2)

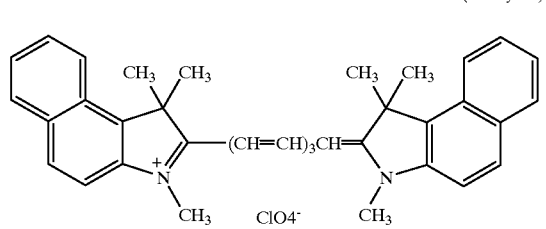

In the solution [E] having the-above-described composition, the type of the compound represented by general formula (1) or (2) was changed to those listed in Table 2, so as toprepare three typesof solutions [E-1] to [E-3]. These solutions were respectively applied on the above-described supporting substrate A and dried for 2 minutes at 100° C. to obtain negative type planographic printing plates [E-1] to [E-3]The coating weight after drying was 1.5 g/m².

The resulting negative type planographic printing plates [E-1] to [E-3] were exposedbya semiconductor laser emitting an infrared ray having a wavelength of 830 nm. After exposure, the plates were heated for 1 minute in an oven at 140° C., and then were processed by passing through an automatic developing machine containing a developing solution DP-4 (1:8) and a rinse solution FR-3 (1:7) both manufactured by Fuji Photo Film Co., Ltd. Then, the surface of the plate was treated by gum GU-7 (1:1) manufactured by Fuji Photo Film Co., Ltd., and printing was effected by a Hydel KOR-D machine. Excellent negative images were obtained on both plates.

TABLE 2

| Example No. | Planographic Printing Plate | Compound |
|---|---|---|
| Example 7 | E-1 | I-b-33 |
| Example 8 | E-2 | I-f-33 |
| Example 9 | E-3 | II-c-21 |
| Comparative Example 3 | Could not be produced | — |

Comparative Example 3

An attempt was made to produce a negative type planographic printing plate [F-1] in the same manner as in Examples 7 to 9 except that in the solutions [E] used in Examples 7 to 9, the above-described diazonium salt (X-1) was used instead of the compounds represented by general formula (1) or (2). However, the pigment was changed in color during the preparation of the solution.

The results of Examples 7 to 9 and Comparative Example 3 show that the planographic printing plates using the negative type image recording materials of the present invention are stable during preparation.

Examples 10 to 13

[Preparation of Supporting Substrate]

An aluminum plate (material 1050) having a thickness of 0.30 mm was degreased by washing with trichloroethylene. Thereafter, a roughening treatment was carried out on the aluminum plate by graining the surface with a nylon brush and an aqueous suspension of 400 mesh pumice powder, and the plate was then washed well with water. This plate was etched by being immersed for 9 seconds in a 25% aqueous sodium hydroxide solution at 45° C., and was then washed with water. Thereafter, the plate was further immersed in 2% $HNO_3$ for 20 seconds and then washed with water. The amount etched of the grained surface was about 3 g/m². Then, this plate was anodized by direct current having a density of 15 A/dm² by using 7% $H_2SO_4$ as an electrolysis solution to form a film of 3 g/m², and was then washed with water and dried. Next, the primer solution as described below was applied to the aluminum plate, and dried at 80° C. for 30 seconds. The amount coated after drying was 10 mg/m². The resultant supporting substrate is referred to as substrate B.

(Composition of Primer Solution)

| | |
|---|---|
| β-Aminoethylphosphonic acid | 0.1 g |
| Methanol | 70 g |
| Pure water | 30 g |

[Production of Planographic Printing Plate]

Solution [C]

| | |
|---|---|
| Compound represented by general formula (1) | 0.20 g |
| Infrared absorbing agent (listed in Table 3) | 0.16 g |
| p-hydroxystyrene polymer | 1.4 g |
| (weight-average molecular weight 20000) | |
| (MARUKA LINCUR M H-2, manufactured by Maruzen Petrochemical Co., Ltd.) | |
| Cross-linking agent HM-1 | 0.6 g |
| (having the following structural formula) | |
| 2,6-bishydroxymethyl-p-cresol | 0.50 g |
| Fluorine-based surfactant | 0.03 g |
| (MEGAFAC F-176, manufactured by Dainippon Ink & Chemicals. Inc.) | |
| Naphthalenesulfonate salt of Victoria Pure Blue | 0.04 g |
| Methyl ethyl ketone | 15 g |
| 1-methoxy-2-propanol | 10 g |
| methyl alcohol | 5 g |

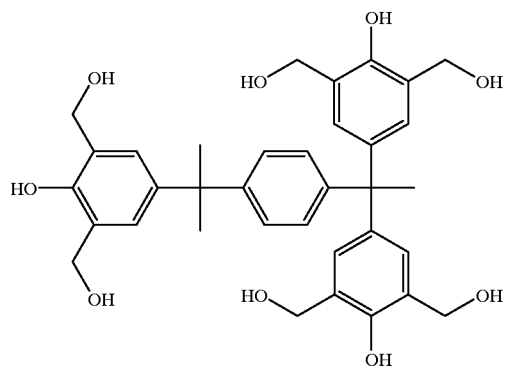

HM-1

In the solution [C] having the above-described composition, the type of the compound represented by general formula (1) and the infrared absorbing agent were changed to those listed in Table 3, so as to prepare three types of solutions [C-1] to [C-33]. Then, in the solution [C-1], the p-hydroxystyrene polymer was changed to a p-hydroxystyrene/methyl methacrylate copolymer (MARUKALINKER CCM, manufactured by Maruzen Sekiyu K. K., weight-average molecular weight 10,000), so as to prepare a solution [C-43]. These solutions were respectively applied on supporting substrates B and dried for 1 minute at 100° C. to obtain negative type planographic printing plates [C-1] to [C-4]. The coating weight after drying was 1.3 g/m².

TABLE 3

| Example No. | Planographic Printing Plate | Compound Represented by General Formula (1) | Infrared Ray Absorbing Agent |
|---|---|---|---|
| Example 10 | C-1 | I-b-31 | IR-Dye-3 |
| Example 11 | C-2 | I-b-33 | IR-Dye-3 |
| Example 12 | C-3 | I-b-31 | IR-Dye-5 |
| Example 13 | C-4 | I-c-33 | IR-Dye-3 |
| Comparative Example 4 | D-1 | X-3 | IR-Dye-3 |

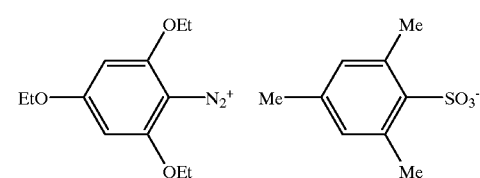

I-b-31

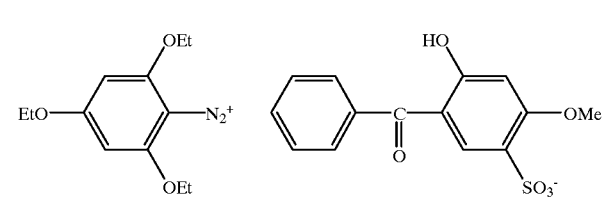

I-b-33

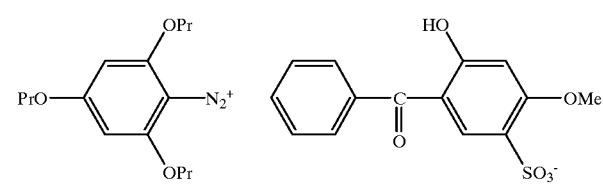

I-c-33

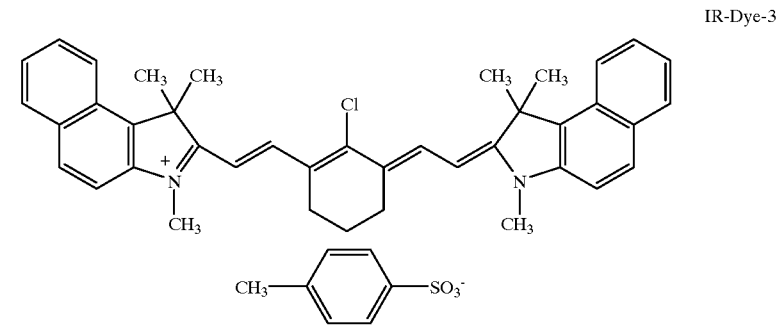

IR-Dye-3

IR-Dye-5

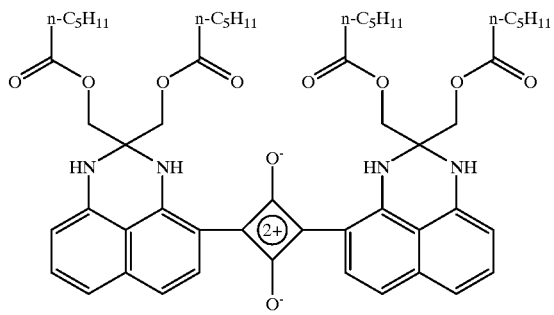

The resulting negative type planographic printing plates [C-1] to [C-4] were left for 10 minutes under white fluorescent light, and were then exposed by a semiconductor laser emitting an infrared ray having a wavelength of 830 nm. After exposure, the plates were heated for 1 minute in an oven at 140° C., and were then processed by passing through an automatic developing machine containing a developing solution DP-4 (1:8) and a rinse solution FR-3 (1:7) both manufactured by Fuji Photo Film Co., Ltd. Then, the surface of the plate was treated by gum GU-7 (1:1) manufactured by Fuji Photo Film Co., Ltd., and printing was effected by a Hydel KOR-D machine. Excellent negative images were obtained on all of the plates.

Comparative Example 4

A negative type planographic printing plate [D-1] was produced in the same manner as in Examples 10 to 13 except that in the solutions [C] used in Examples 10 to 13, the diazonium salt (X-3) having the following structure was used instead of the compound represented by general formula (1).

In the same manner as in Examples 10 to 13, the resulting planographic printing plate [D-1] was left for 10 minutes under white fluorescent light, then exposed, heated and developed, and printing was effected by a Hydel KOR-D machine. It was found that stains had formed on the non-image parts.

X-3

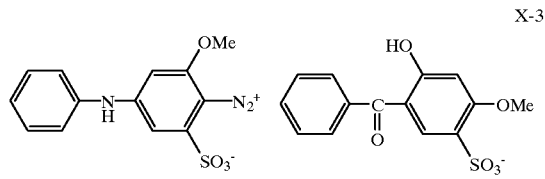

The results of Examples 10 to 13 and Comparative Example 4 show that the negative type image recording materials of the present invention have excellent handling stability under white fluorescent light.

What is claimed is:

1. An image recording material comprising at least one diazonium salt represented by following general formula (1), an infrared ray absorbing agent, a cross-linking agent which is cross-linked in the presence of an acid, and a binder, general formula (1)

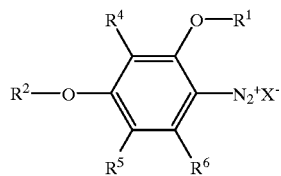

wherein each of $R_1$ and $R_2$ independently represents a substituted or unsubstituted hydrocarbon group having 20 or fewer carbon atoms, each of $R_4$ and $R_5$ independently represents a hydrogen atom or a substituted or unsubstituted hydrocarbon group having 20 or fewer carbon atoms, $R_6$ represents a hydrogen atom, a substituted or unsubstituted alkyloxy group, aryloxy group or aralkyloxy group having 20 or fewer carbon atoms, and X represents a counter anion selected from F, Cl, Br, I, $ClO_4$, $BF_4$, $PF_6$, $SbF_6$, $AsF_6$, alkylsulfonate ion and arylsulfonate ion.

2. The image recording material according to claim 1, wherein $R_6$ in general formula (1) represents $OR_3$, wherein $R_3$ represents a linear, branched or alicyclic alkyl group having 1 to 12 carbon atoms, or an aromatic ring having 6 to 10 carbon atoms, or an aralkyl group having 7 to 12 carbon atoms.

3. The image recording material according to claim 1, wherein the infrared ray absorbing agent is a dye or pigment which absorbs infrared rays of 760 nm to 1200 nm.

4. The image recording material according to claim 1, wherein the cross-linking agent is selected from the group consisting of i) aromatic compounds substituted by an alkoxymethyl or a hydroxymethyl group, ii) compounds containing an N-hydroxymethyl, an N-alkoxymethyl or an N-acyloxymethyl group, and iii) epoxy compounds.

5. The image recording material according to claim 1, wherein an amount of the cross-linking agent is from 5 to 80% by weight based on a total solid content of the image recording material.

6. The image recording material according to claim 1, wherein the binder is a novolak resin, or a polymer containing a hydroxyaryl group on the side chain of the polymer.

7. The image recording material according to claim 6, wherein the hydroxyaryl group is selected from the group consisting of hydroxyphenyl, dihydroxyphenyl, trihydroxyphenyl, tetrahydroxyphenyl, hydroxynaphthyl, and dihydroxynaphthyl groups, and the hydroxyaryl group may contain a substituent selected from the group consisting of a halogen atom, an alkyl group having 20 or fewer carbon atoms, an alkoxy group having 20 or fewer carbon atoms, and an aryloxy group having 20 or fewer carbon atoms.

8. The image recording material according to claim 6, wherein the polymer containing the hydroxyaryl group on the side chain is represented by at least one formula selected from the group of the following general formulae (IX) to (XII):

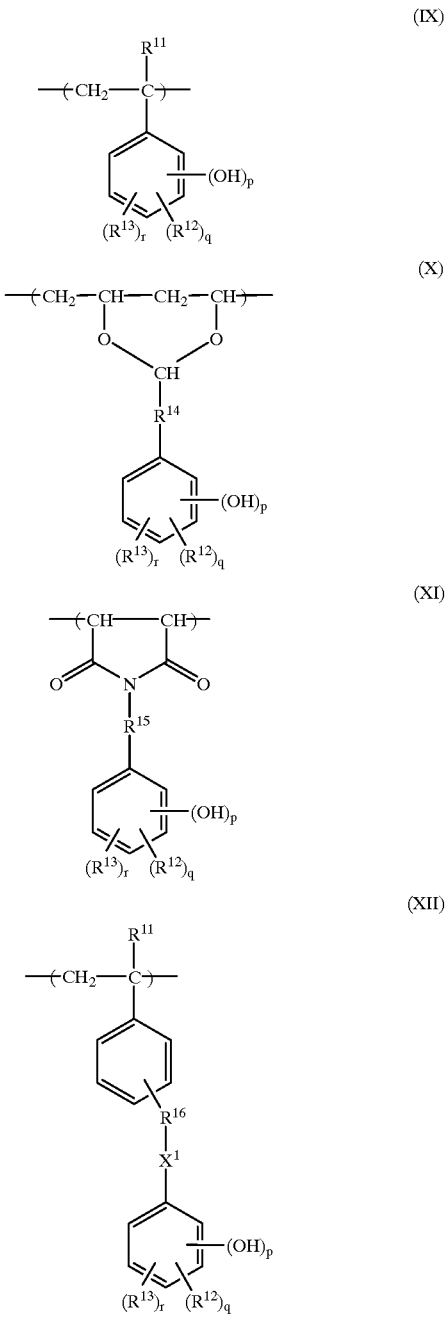

wherein $R^{11}$ represents a hydrogen atom or a methyl group, $R^{12}$ and $R^{13}$, which are the same or different, each represent a hydrogen atom, a halogen atom, an alkyl group having 10 or fewer carbon atoms, an alkoxy group having 10 or fewer carbon atoms or an aryloxy group having 10 or fewer carbon atoms, or R12 and R13 may be linked to each other to form a condensed benzene ring or a cyclohexane ring, $R^{14}$ represents a single bond or a divalent hydrocarbon group having 20 or fewer carbon atoms, $R^{15}$ represents a single bond or a divalent hydrocarbon group having 20 or fewer carbon atoms, $R^{16}$ represents a single bond or a divalent hydrocarbon group having 20 or fewer carbon atoms, X1 represents a single bond, an ether bond, a thioether bond, an ester bond or an amide bond, p represents an integer of 1 to 4, and q and r each represent an integer of 0 to 3.

9. A planographic plate comprising a substrate having thereon a recording layer containing at least one diazonium salt represented by following general formula (1), an infrared ray absorbing agent, a cross-linking agent which is cross-linked in the oresence of an acid, and a binder,

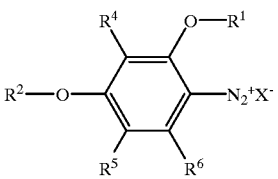

general formula (1)

wherein each of $R_1$ and $R_2$ independently represents a substituted or unsubstituted hydrocarbon group having 20 or fewer carbon atoms, each of $R_4$ and $R_5$ independently represents a hydrogen atom, or a substituted or unsubstituted hydrocarbon group having 20 or fewer carbon atoms, $R_6$ represents a hydrogen atom, or a substituted or unsubstituted alkyloxy group, aryloxy group or aralkyloxy group having 20 or fewer carbon atoms, and X represents a counter anion selected from the group consisting of F, Cl, Br, $ClO_4$, $BF_4$, $PF_6$, $SbF_6$, $AsF_6$, alkylsulfonate ion and arylsulfonate ion.

10. The planographic plate according to claim 9, wherein $R_6$ in general formula (1) represents $OR_3$, wherein $R_3$ represents a liner, branched or alicyclic alkyl group having 1 to 12 carbon atoms, or an aromatic ring having 6 to 10 carbon atoms, or an aralkyl group having 7 to 12 carbon atoms.

11. The planographic plate according to claim 9, wherein the infrared ray absorbing agent is a dye or pigment which absorbs infrared rays of 760 nm to 1200 nm.

12. The planographic plate according to claim 9, wherein the cross-linking agent is selected from the group consisting of i) aromatic compounds substituted by an alkoxymethyl or a hydroxymethyl group, ii) compounds containing an N-hydroxymethyl, an N-alkoxymethyl or an N-acyloxymethyl group, and iii) epoxy compounds.

13. The planographic plate according to claim 9, wherein an amount of the cross-linking agent is from 5 to 80% by weight based on a total solid content of the image recording material.

14. The planographic plate according to claim 9, wherein the binder is a novolak resin, or a polymer containing a hydroxyaryl group on the side chain of the polymer.

15. The planographic plate according to claim 9, wherein the hydroxyaryl group is selected from the group consisting of hydroxyphenyl, dihydroxyphenyl, trihydroxyphenyl, tetrahydroxyphenyl, hydroxynaphthyl, and dihydroxynaphthyl groups, and the hydroxyaryl group may contain a substituent selected from the group consisting of a halogen atom, an alkyl group having 20 or fewer carbon atoms, an alkoxy group having 20 or fewer carbon atoms, and an aryloxy group having 20 or fewer carbon atoms.

16. The planographic plate according to claim 9, wherein the polymer containing the hydroxyaryl group on the side chain is represented by at least one formula selected from the group of the following general formulae (IX) to (XII):

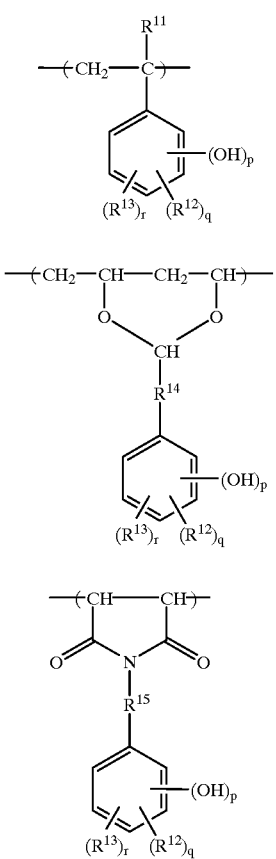

-continued

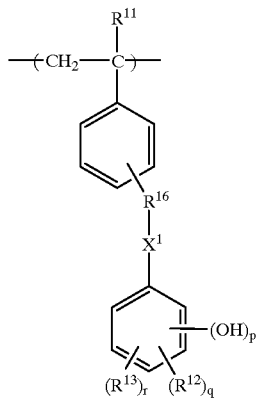

(XII)

wherein $R^{11}$ represents a hydrogen atom or a methyl group, $R^{12}$ and $R^{13}$, which are the same or different, each represent a hydrogen atom, a halogen atom, an alkyl group having 10 or fewer carbon atoms, an alkoxy group having 10 or fewer carbon atoms or an aryloxy group having 10 or fewer carbon atoms, or $R^{12}$ and $R^{13}$ may be linked to each other to form a condensed benzene ring or a cyclohexane ring, $R^{14}$ represents a single bond or a divalent hydrocarbon group having 20 or fewer carbon atoms, $R^{15}$ represents a single bond or a divalent hydrocarbon group having 20 or fewer carbon atoms, $R^{16}$ represents a single bond or a divalent hydrocarbon group having 20 or fewer carbon atoms, X1 represents a single bond, an ether bond, a thioether bond, an ester bond or an amide bond, p represent an integer of 1 to 4, and q and r each represent an integer of 0 to 3.

17. The planographic plate according to claim 9, wherein an amount of the cross-linking agent is from 10 to 75% by weight based on a total solid content of the image recording material.

18. The planographic plate according to claim 9, wherein an amount of the cross-linking agent is from 20 to 70% by weight based on a total solid content of the image recording material.

* * * * *